US010128612B1

(12) United States Patent
Casto

(10) Patent No.: US 10,128,612 B1
(45) Date of Patent: Nov. 13, 2018

(54) DUAL PURPOSE LATCH

(71) Applicant: Cubic Corporation, San Diego, CA (US)

(72) Inventor: Paul Casto, Ashburn, VA (US)

(73) Assignee: Cubic Corporation, San Diego, CA (US)

( * ) Notice: Subject to any disclaimer, the term of this patent is extended or adjusted under 35 U.S.C. 154(b) by 0 days.

(21) Appl. No.: 15/975,531

(22) Filed: May 9, 2018

Related U.S. Application Data

(60) Provisional application No. 62/503,973, filed on May 10, 2017, provisional application No. 62/503,847, filed on May 9, 2017.

(51) Int. Cl.
| | |
|---|---|
| *H05K 7/14* | (2006.01) |
| *H01R 13/627* | (2006.01) |
| *H01R 13/629* | (2006.01) |
| *H05K 7/02* | (2006.01) |
| *H05K 5/00* | (2006.01) |

(52) U.S. Cl.
CPC ....... *H01R 13/6275* (2013.01); *H01R 13/629* (2013.01); *H05K 5/0021* (2013.01); *H05K 7/023* (2013.01); *H05K 7/1401* (2013.01)

(58) Field of Classification Search
CPC .............. H01R 13/6275; H01R 13/629; H05K 5/0021; H05K 7/023; H05K 7/1401
See application file for complete search history.

(56) References Cited

U.S. PATENT DOCUMENTS

| | | | | | |
|---|---|---|---|---|---|
| 5,435,737 | A | * | 7/1995 | Haga | G06F 1/183 361/679.37 |
| 5,864,467 | A | * | 1/1999 | Recchia | H05K 5/0021 174/561 |
| 6,085,925 | A | * | 7/2000 | Chung | H05K 5/0021 206/511 |
| 6,844,865 | B2 | * | 1/2005 | Stasko | F16M 11/048 345/1.3 |
| 7,355,562 | B2 | * | 4/2008 | Schubert | G09F 9/33 345/1.3 |
| D590,789 | S | * | 4/2009 | Pozin | D14/126 |
| 9,408,321 | B2 | * | 8/2016 | Nomoto | H05K 5/0021 |
| 2004/0069518 | A1 | * | 4/2004 | Fan | H05K 5/0021 174/50 |
| 2006/0172787 | A1 | * | 8/2006 | Ellis | A63F 13/10 463/1 |

(Continued)

*Primary Examiner* — James Wu
(74) *Attorney, Agent, or Firm* — Kilpatrick Townsend and Stockton, LLP

(57) ABSTRACT

An electronics module includes a housing having four sides and defining an axis extending from a front to rear of the housing. Each side defines a mating feature that engages a mating feature of another electronics module. One side defines a pin-receiving receptacle, another defines a recess extending partially through a width or a thickness of the housing; and another includes a catch mechanism. A latch is mounted within the recess and includes a body having top, bottom, front, rear, inner side, and outer side surfaces. The bottom or top surface defines an opening to a vertical channel formed in the body. A hook extends from the rear surface and secures a catch on the other module. A spring-biased pin is received within the channel and mounted within the recess such that an end of the pin extends through the opening beyond a surface of the electronics housing.

20 Claims, 24 Drawing Sheets

(56) References Cited

U.S. PATENT DOCUMENTS

| | | | | |
|---|---|---|---|---|
| 2009/0225506 A1* | 9/2009 | Lee | .................... | H05K 5/0017 361/679.21 |
| 2017/0105293 A1* | 4/2017 | Kim | .................... | H05K 5/0017 |
| 2017/0188479 A1* | 6/2017 | Unger | .................. | H05K 7/1469 |

* cited by examiner

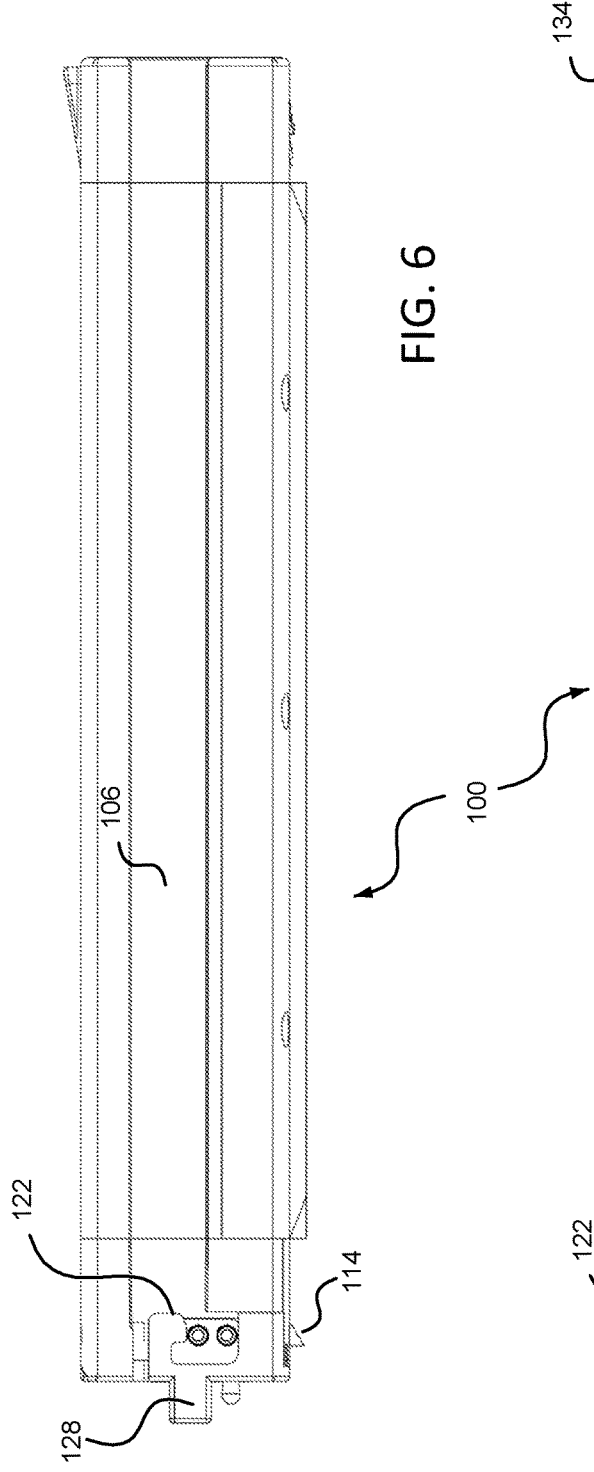
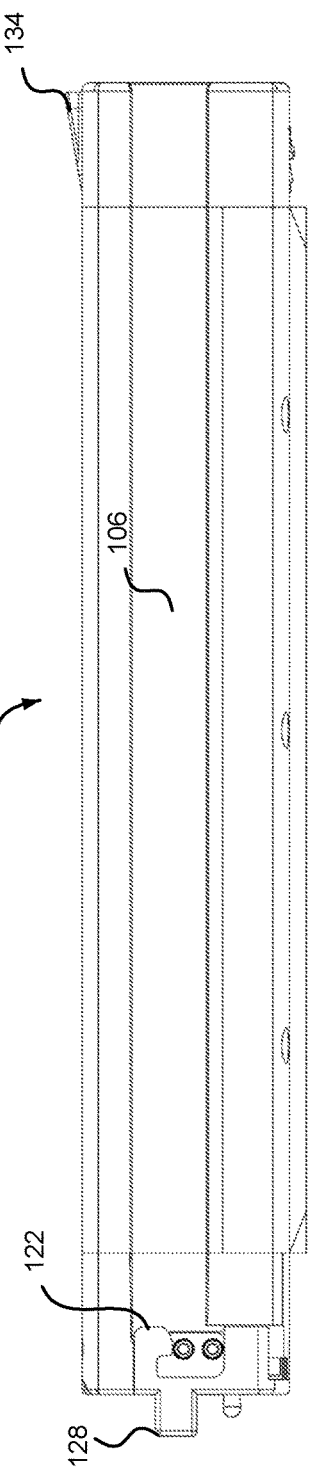

DUAL PURPOSE LATCH

CROSS-REFERENCES TO RELATED APPLICATIONS

This application claims the benefit of U.S. Provisional Application No. 62/503,847, entitled "DUAL PURPOSE LATCH", filed on May 9, 2017, and U.S. Provisional Application No. 62/503,973, entitled "ENVIRONMENTALLY SEALED SWIPING SPRING PIN CONNECTOR", filed on May 10, 2017, the entire contents of which are hereby incorporated by reference.

BACKGROUND OF THE INVENTION

Conventional electronics modules may be stacked or arranged in a side-by-side fashion. However, to secure multiple modules in the various configurations with movement of the modules relative to one another being constrained in three dimensions, multiple latch or other securement mechanisms are needed. For example, one type of connector may be used to secure the modules in a vertical arrangement, while separate connector may be necessary to secure modules in a horizontal arraignment. This unnecessarily increases the complexity and cost of modular systems and limits the number of arrangement options for multiple modules.

Traditional environmentally-sealed spring connections are used in compression style designs where the sealing gaskets are mounted so that they compress in the same direction as the spring in. Such connections are not compatible with swiping configurations. Other spring pin connections may compress the pins and then rotate or slide into their final position. However, such connections are very complex and may be less durable and robust than desired in many applications. Improvements in environmentally-sealed spring connections are desired.

BRIEF SUMMARY OF THE INVENTION

Embodiments of the present invention provide dual-purpose latches that are capable of locking modular units together in a horizontal and/or a vertical fashion using a single latch. Embodiments also provide solutions for environmentally-sealing spring connections in a swiping configuration, enabling easy sliding connection between electrical connectors of multiple electronic modules where the connection is sealed from the outside environment. Embodiments of the present invention provide robust and customizable solutions for stacking or otherwise coupling multiple electronic modules together.

In one embodiment, a bi-directional electronics module system is provided. The system may include a first electronics module and a second electronics module. Each of the first electronics module and the second electronics module may include a housing that includes a first side, a second side positioned opposite the first side, a third side extending in a generally orthogonal direction between the first side and the second side, and a fourth side parallel to and positioned opposite the third side. The electronics housing may define an axis extending from a front to rear of the electronics module. Each of the sides may define a mating feature configured for sliding engagement with a corresponding mating feature of another electronics module in a direction that is parallel to the axis. The first side may further define a pin-receiving receptacle. The third side may further define a recess extending partially through a width or a thickness of the electronics housing. The fourth side may include a catch mechanism. Each of the modules may include a dual-purpose latch mounted at least partially within the recess. The latch may include a latch body having a top surface, a bottom surface, a front surface, a rear surface, an inner side surface, and an outer side surface. One of the bottom surface or the top surface may define an opening to a generally vertically oriented channel formed in the latch body. The latch may also include a hook feature extending rearward from the rear surface and configured to latch onto a corresponding catch mechanism on the another electronics module. The latch may further include a spring-biased pin that is received within the channel and mounted within the recess such that a distal end of the pin extends from the opening beyond the one of the bottom surface or the top surface and beyond at least a portion of the second side of the electronics module. The first electronics module and the second electronics module may be positionable in a locked stacked arrangement and a locked side-by-side arrangement in which relative movement between the first electronics module and the second electronics module is constrained in three dimensions. When in a first of the locked stacked arrangement or the locked side-by-side arrangement the spring-biased pin of the first electronics module may be engaged with the pin-receiving receptacle of the second electronics module and mating features on respective adjacent sides of the first electronics module and the second electronics module are in sliding engagement with one another. When in a second of the locked stacked arrangement or the locked side-by-side arrangement the hook feature of the first electronics module may be engaged with the catch mechanism of the second electronics module and mating features on respective adjacent sides of the first electronics module and the second electronics module are in sliding engagement with one another.

In another embodiment, an electronics module having a dual-purpose latch is provided. The module may include an electronics housing including a first side, a second side positioned opposite the first side, a third side extending in a generally orthogonal direction between the first side and the second side, and a fourth side parallel to and positioned opposite the third side. The electronics module may define an axis extending from a front to rear of the electronics housing. Each of the sides may define a mating feature configured for sliding engagement with a corresponding mating feature of another electronics module in a direction that is parallel to the axis. The first side may further define a pin-receiving receptacle. The third side may further define a recess extending partially through a width or a thickness of the electronics housing. The fourth side may include a catch mechanism. The module may include a dual-purpose latch mounted at least partially within the recess. The latch may include a latch body having a top surface, a bottom surface, a front surface, a rear surface, an inner side surface, and an outer side surface. One of the bottom surface or the top surface may define an opening to a generally vertically oriented channel formed in the latch body. The latch may also include a hook feature extending rearward from the rear surface and configured to latch onto a corresponding catch mechanism on the another electronics module. The latch may further include a spring-biased pin that is received within the channel and mounted within the recess such that a distal end of the pin extends from the opening beyond the one of the bottom surface or the top surface and beyond at least a portion of the second side of the electronics housing. The spring-biased pin enables the dual-purpose latch to slide between a disengaged position and a engaged position. In the disengaged position the pin and the hook feature are disengaged from the another electronics module housing. In the engaged position the pin or the hook feature is engaged with the another electronics housing so as to constrain movement of the electronics module housing relative to the another electronics module housing along the axis.

In another embodiment, a method of coupling electronics modules is provided. The method may include providing a first electronics module and a second electronics module. Each electronics module may include an electronics housing including a first side, a second side positioned opposite the first side, a third side extending in a generally orthogonal direction between the first side and the second side, and a fourth side parallel to and positioned opposite the third side. The electronics module may define an axis extending from a front to rear of the electronics module, wherein each of the sides defines a mating feature configured for sliding engagement with a corresponding mating feature of another electronics module in a direction that is parallel to the axis. The method may include engaging a mounting feature from one of the sides of the first electronics module with a corresponding mating feature from an opposite side of the second electronics module to constrain movement of the electronics modules relative to one another in two directions that are generally orthogonal to the axis. The method may further include sliding the first electronics module relative to the second electronics module in a direction that is generally parallel to the axis and engaging a dual-purpose latch of the first electronics housing with an engagement feature on the second electronics housing such that one of a hook feature or a spring biased pin of the dual-purpose latch constrains movement of the electronics modules relative to one another in a direction that is generally parallel to the axis.

In another embodiment, a bi-directional electronics module system includes a first electronics module and a second electronics module. Each of the first electronics module and the second electronics module may include an electronics housing including a first side, a second side positioned opposite the first side, a third side extending in a generally orthogonal direction between the first side and the second side, and a fourth side parallel to and positioned opposite the third side. The electronics module may define an axis extending from a front to rear of the electronics housing. The first side may define a first electrical connector having a first mounting seat. The first mounting seat may be sloped at an angle relative to the first side. The second side may define a second electrical connector having a second mounting seat. The second mounting seat may be sloped at the angle relative to the second side. The second mounting seat may be sloped in an opposite direction as the first mounting seat. A first of the first electrical connector and the second electrical connector may include a plurality of spring-loaded pins. The plurality of spring-loaded pins may be generally orthogonal to the angle relative to the respective mounting seat. The plurality of spring-loaded pins may be biased in an extended position. A second of the first electrical connector and the second electrical connector may define a plurality of pin-receiving receptacles that are generally orthogonal to the angle of the respective mounting seat. At least one of the first electrical connector and the second electrical connector may include a gasket positioned on the respective mounting seat. The first electronics module and the second electronics module may be positionable in one or both of a stacked arrangement or a side-by-side arrangement in which the plurality of spring-loaded pins of one of the first electronics module and the second electronics module are received within the plurality of pin-receiving receptacles of the other of the first electronics module and the second electronics module. In the stacked arrangement or a side-by-side arrangement the first mounting seat of the one of the first electronics module and the second electronics module is positioned flush against the second mounting seat of the other of the first electronics module and the second electronics module so as to seal a connection between the plurality of spring-loaded pins and the plurality of pin-receiving receptacles from an outside environment.

In another embodiment, an electronics module having an environmentally sealed swiping spring pin connector is provided. The module may include an electronics housing including a first side, a second side positioned opposite the first side, a third side extending in a generally orthogonal direction between the first side and the second side, and a fourth side parallel to and positioned opposite the third side. The electronics module may define an axis extending from a front to rear of the electronics housing. The first side may define a first electrical connector having a first mounting seat. The first mounting seat may be sloped at an angle relative to the first side. The second side may define a second electrical connector having a second mounting seat. The second mounting seat may be sloped at the angle relative to the second side. The second mounting seat may be sloped in an opposite direction as the first mounting seat. A first of the first electrical connector and the second electrical connector may include a plurality of spring-loaded pins. The plurality of spring-loaded pins may be generally orthogonal relative to the respective mounting seat. The plurality of spring-loaded pins may be biased in an extended position. A second of the first electrical connector and the second electrical connector may define a plurality of pin receiving receptacles that are generally orthogonal angle to the respective mounting seat. At least one of the first electrical connector and the second electrical connector may include a gasket positioned on the respective mounting seat.

In another embodiment, method of coupling electronics modules includes providing a first electronics module and a second electronics module. Each of the electronics modules may include an electronics housing including a first side, a second side positioned opposite the first side, a third side extending in a generally orthogonal direction between the first side and the second side, and a fourth side parallel to and positioned opposite the third side. The electronics module may define an axis extending from a front to rear of the electronics module. Each of the sides may define a mating feature configured for sliding engagement with a corresponding mating feature of another electronics module in a direction that is parallel to the axis. The method may include engaging a mounting feature from one of the sides of the first electronics module with a corresponding mating feature from an opposite side of the second electronics module to constrain movement of the electronics modules relative to one another in two directions that are generally orthogonal to the axis. The method may also include sliding the first electronics module relative to the second electronics module in a direction that is generally parallel to the axis and coupling a plurality of spring loaded pins of a first angled electrical connector with a plurality of pin-receiving receptacles of a second angled electrical connector on the second electronics housing such that a first mounting seat of the first electronics module is positioned flush against the second mounting seat of the second electronics module so as to seal a connection between the plurality of spring-loaded pins and the plurality of pin-receiving receptacles from an outside environment. The first mounting seat and the second mounting seat may be sloped at an angle relative to their respective electronics modules. The second mounting seat may be sloped in an opposite direction as the first mounting seat. The plurality of spring-loaded pins may be generally orthogonal relative to the first mounting seat. The plurality of spring-loaded pins may be biased in an extended position. The plurality of pin receiving receptacles may be generally orthogonal angle to the second mounting seat.

BRIEF DESCRIPTION OF THE DRAWINGS

A further understanding of the nature and advantages of various embodiments may be realized by reference to the following figures.

FIG. 6 depicts a side view of the electronics module of FIG. 1 with the dual-purpose latch in an engaged position.

FIG. 7 depicts a side view of the electronics module of FIG. 1 with the dual-purpose latch in a disengaged position.

DETAILED DESCRIPTION OF THE INVENTION

Figure 1:
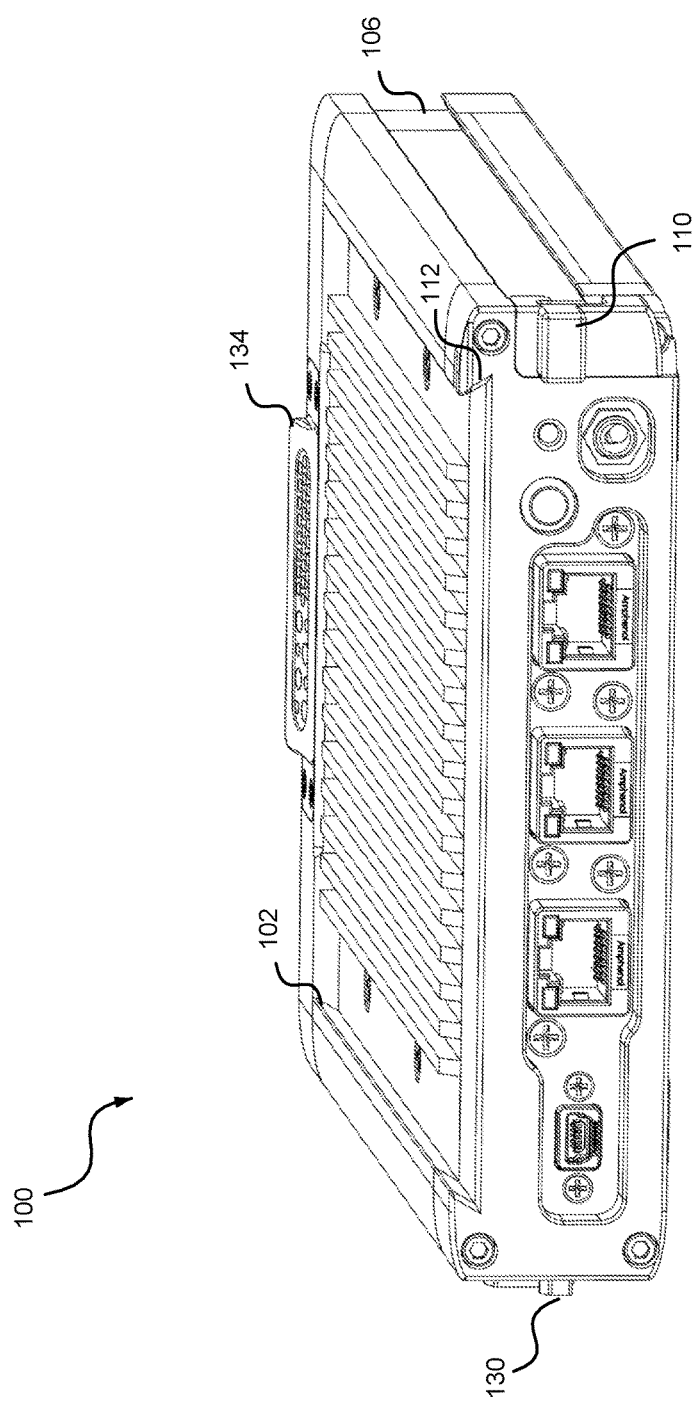
FIG. 1 depicts a top isometric view of an electronics module having a dual-purpose latch according to embodiments.

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Embodiments of the invention(s) described herein are generally related to interconnectivity of electronic modules. Embodiments of the present invention provide modular electronics units that may be locked in engagement with one another using a single latch to simultaneously couple modules in a vertical stack arrangement or a side-by-side arrangement. This provides the ability for any number of electronics modules to be stacked and our mounted in a side-by-side fashion to fit the needs and space constraints of a particular application. Embodiments of the invention also provide angled external electrical connectors on each of the electronics modules that enable the connectors from multiple electronics modules to be slidingly engaged with one another to provide a connection that is sealed from the outside environment.

Embodiments provide for electronics modules to interconnect both vertically and horizontally using a single, dual-purpose latch. This can enable modular electronics modules to scale both up and down while allowing flexibility to physically mount in many configurations. For example, the electronic modules may be interconnected vertically and/or horizontally using the single latch, without having to use multiple mechanisms.

Among other advantages, embodiments of the dual-purpose latch may reduce the complexity of the electronic module design. It requires fewer parts and takes up less physical space. The dual-purpose latches described herein are also simpler to use than conventional modular unit coupling mechanism.

While generally used to secure connections between electronic modules, it will be appreciated that applications for the dual-purpose latches described herein are not so limited. For example, the dual-purpose latches described herein may be used to physically secure multiple units of any type of modular product together.

Embodiments of the present invention(s) also generally relate to environmentally-sealed electrical connectors. Embodiments may be used anywhere an environmental seal is needed for an electrical connection that uses a swiping action. It will be appreciated that applications are not so limited.

Embodiments of the invention(s) provide for an environmentally sealed swiping spring pin connector that allows a designer to utilize the sealing qualities of a spring pin connector while mounting it in a swiping configuration. This allows the designer to create an environmental seal around the mated connection.

Embodiments of the environmentally-sealed swiping spring pin connectors described herein provide a unique angled design of the connector that creates a gradual compression action on the spring pins, which allows the spring pins to be compressed during the swiping action of their connection without being damaged. The unique angle also allows a gasket to create an environmental seal around the mated connection with minimal drag due to the swiping configuration. This results in minimal gasket wear and a reduced tendency for the gasket to "roll" out of its mounting groove. The unique angle design also creates a compression force on the gasket when the connection is fully seated even though its main connection is created during a swiping action. This results in a better environmental seal than swiping alone could achieve.

Among other advantages, embodiments can allow for designs where a swiping action would better suit the product but that also need an environmental seal for a mated and unmated electrical connection.

Figure 2:
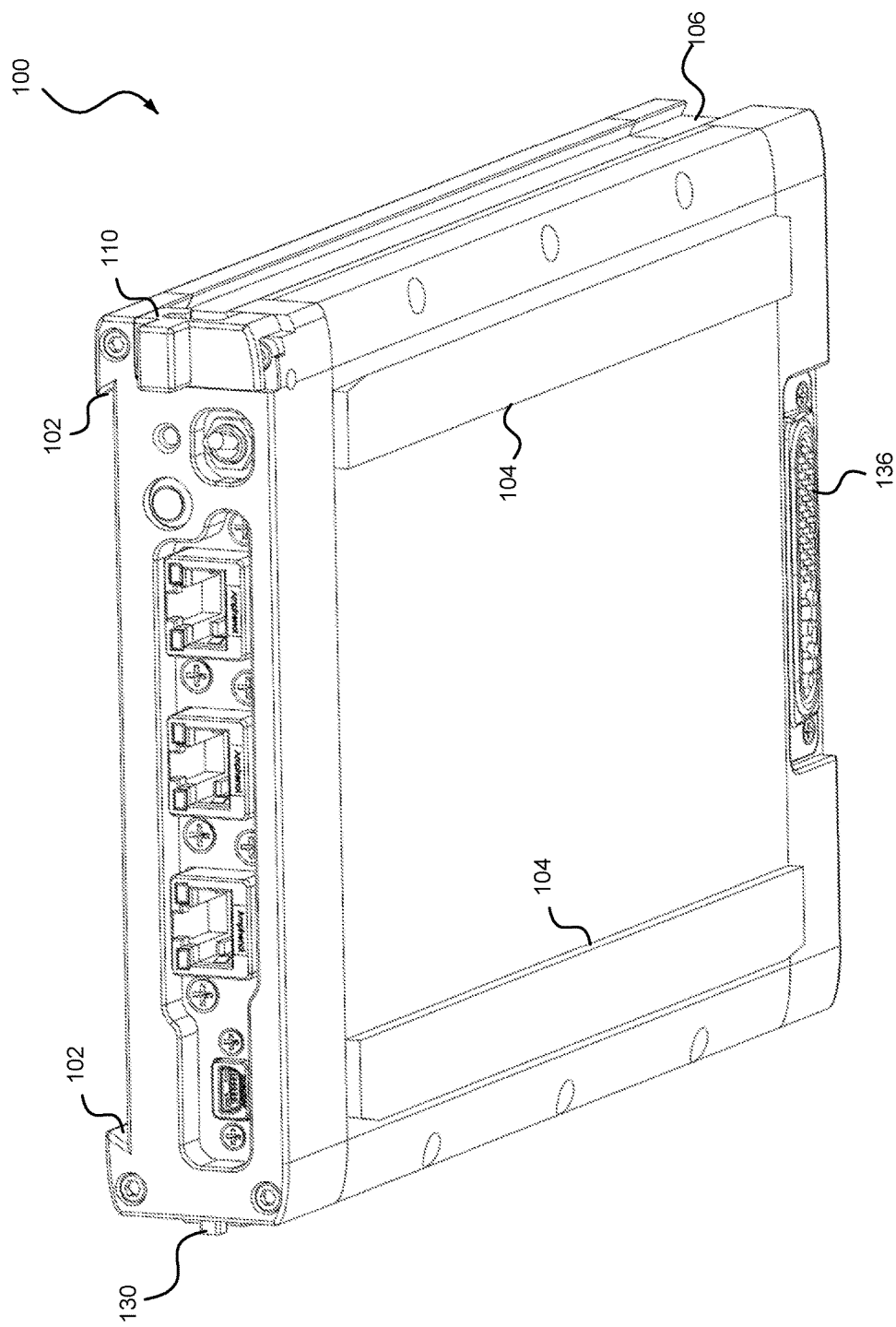
FIG. 2 depicts a bottom isometric view of the electronics module of FIG. 1.

Turning now to FIG. 1, one embodiment of an electronics module 100 is shown. In the illustrated embodiment, electronics module 100 is generally rectangular prism shaped, however other shapes of electronics modules may be contemplated. In the present embodiment, electronics modules include rounded corners and some rounded edges, however, pointed cornered and edges may also be used. Electronics module 100 includes a housing having a front side, a rear side, a top side, a bottom side, a left side, and a right side. The electronics module 100 may define an axis (such as a longitudinal axis) extending from the front side to the rear side. Each or the top side, bottom side, left side, and right side may include one or more mating features that are configured to slidingly engage with those on another electronics module. For example, a top side of electronics module 100 may define one or more channels or recesses 102, while a bottom side of electronics module 100 may include one or more dovetail features 104 that are sized, shaped, and positioned to correspond with the recesses 102 as shown in FIG. 2. While shown having a smaller dovetail features 104 positioned on either side of the electronics module 100, it will be appreciated that a single large dovetail feature may be used or more than two dovetail features 104 may be used. In some embodiments, the recesses 102 may extend through an entirety of a length of the top side such that a corresponding dovetail feature may be inserted from either a front or rear of the top side. In other embodiments, the recesses 102 may only extend partway through a length of the top side, with a wall or other stop mechanism forming an end of the recesses 102. In such embodiments, a dovetail feature may only be inserted within each recess from a single direction. For example, in the illustrated embodiment a dovetail feature may be inserted into recesses 102 from a front of the top side, and may be slid inward until a rear end of the dovetail feature contacts a rear wall of the recesses 102, thereby liming the insertion depth and making it easy to properly align the stacked modules as the position of the rear wall may be used to limit the insertion depth at a position in which the rear sides of the stacked modules are in alignment with one another.

Figure 3:
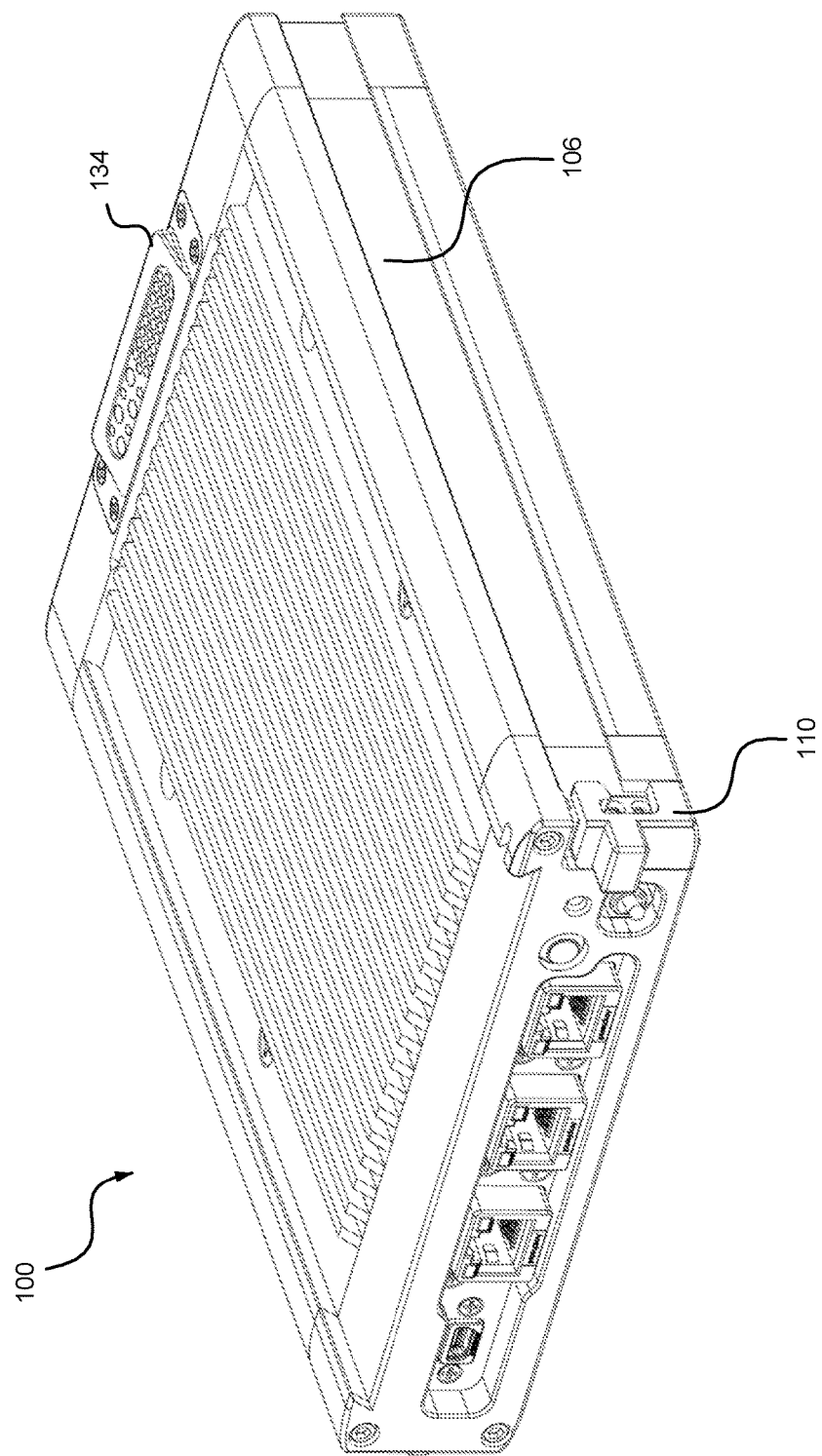
FIG. 3 depicts a left isometric view of the electronics module of FIG. 1.
Figure 4:
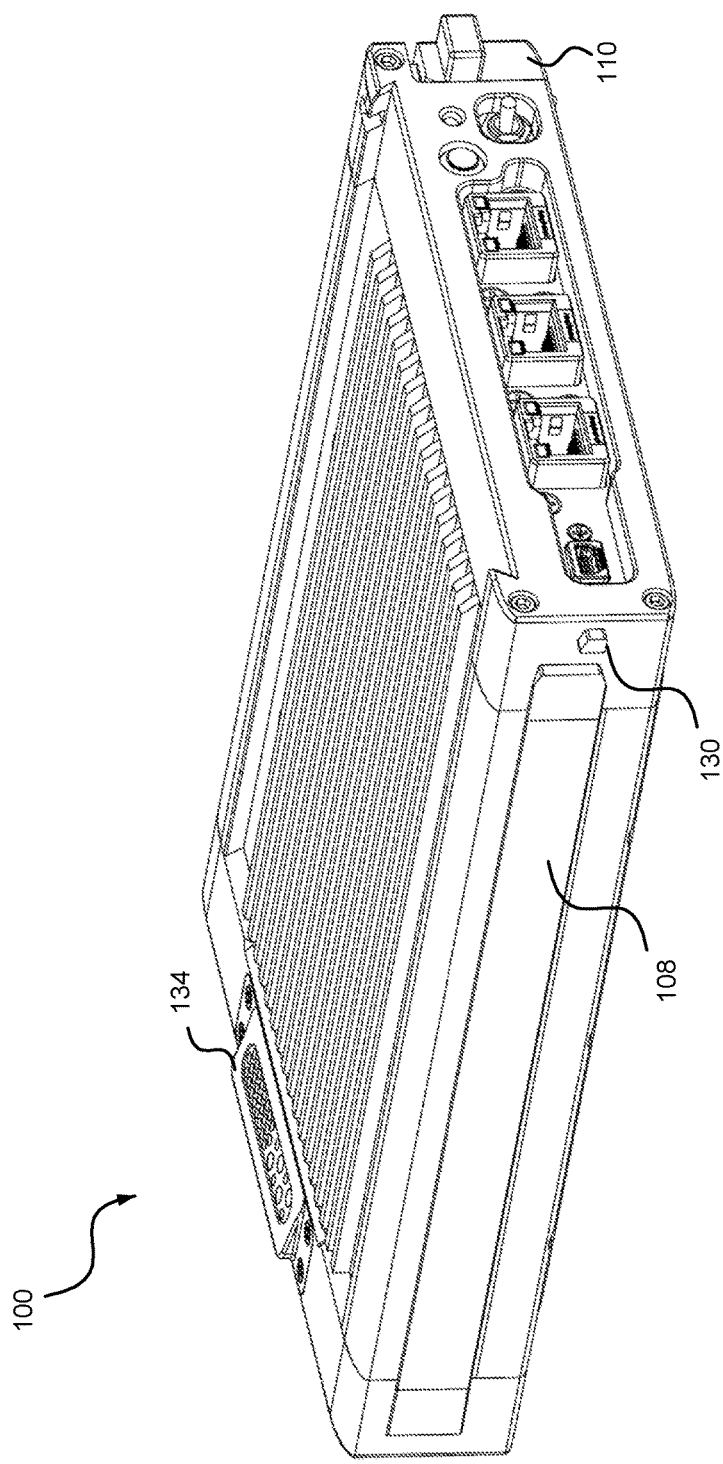
FIG. 4 depicts a right isometric view of the electronics module of FIG. 1.

As shown in FIG. 3 the left side of electronics housing 100 may define another channel or recess 106, while a right side of electronics module 100 may include one or more dovetail features 108 that are sized, shaped, and positioned to correspond with the recess 102 as shown in FIG. 4. While shown having a single dovetail feature 108, it will be appreciated that some embodiments may utilize multiple dovetail features 108 In some embodiments, the recess 106 may extend through an entirety of a length of the left side such that a corresponding dovetail feature may be inserted from either a front or rear of the left side. In other embodiments, the recess 106 may only extend partway through a length of the top side, with a wall or other stop mechanism forming an end of the recess 106. In such embodiments, a dovetail feature may only be inserted within each recess from a single direction. For example, a dovetail feature may be inserted into recess 106 from a rear of the left side, and may be slid inward until a front end of the dovetail feature contacts a front wall of the recess 106, thereby liming the insertion depth and making it easy to properly align the side-by-side modules as the position of the front wall may be used to limit the insertion depth at a position in which the front sides of the side-by-side modules are in alignment with one another.

By including corresponding mating features on opposite sides of the electronics housing 100 in this manner, multiple modules may be slid into a stacked and/or side-by-side arrangement with one another with two directions of movement (vertical and horizontal in a lateral left/right direction) being constrained by the engagement of the dovetail features 104 of one module with the recesses 102 of another module, with only sliding movement along the longitudinal axis being possible. Such a design enables a set of electronics modules 100 to be produced that have identical housings and yet, may be coupled with one another in both horizontal and vertical arrangements. This allows any number of configurations involving any number of electronics modules 100 to meets the particular space constraints of particular application or setting.

It will be appreciated that the various mating features may be changed. For example, the top side may include the one or more dovetail features 104 and the bottom side may define the one or more channels or recesses 102. Such changes are possible as long as corresponding mating features are disposed on opposite sides of the electronics housing 100 to maintain the simple modular stacking capabilities described above. It will be appreciated that while dovetail features and corresponding recesses or channels are shown, other mating features that enable similar sliding engagement between multiple electronics modules 100 may be used.

Figure 5:
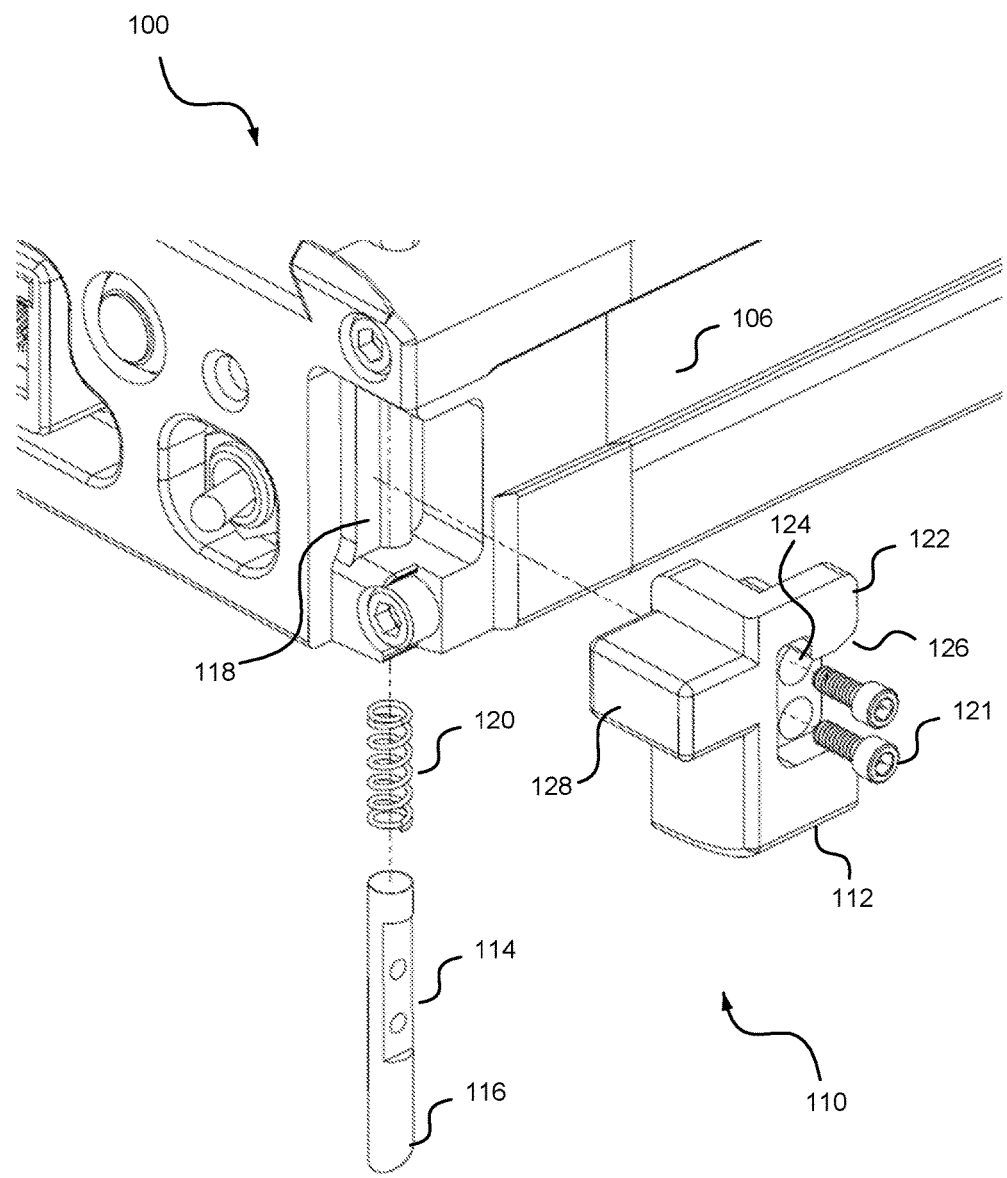
FIG. 5 depicts an exploded view of the dual-purpose latch of the electronics module of FIG. 1.

As noted above, once the various mating features of multiple electronics modules are engaged, relative movement between the electronics modules will be constrained in two directions, with sliding movement along the axis being possible. To lock the modules in place with respect to one another and to prevent this sliding along the axis, a dual-purpose latch 110 may be provided as shown in FIG. 5. Latch 110 includes a latch body 112 having a top surface, a bottom surface, a front surface, a rear surface, an inner side surface, and an outer side surface. The bottom surface and/or the top surface defines an opening (not shown) to a generally vertically oriented channel (not shown) formed in the latch body 112. A spring-biased pin 114 is received within the channel and a distal end 116 of the pin 114 extends from the opening beyond the bottom surface and/or the top surface of the latch body 112. The distal end 116 of pin 114 may also extend beyond at least a portion of an end of the side of the housing of the electronics module 100 on which the latch 110 is mounted. For example, if the latch 110 is mounted on the left side of the electronics module 100, then the distal end 116 of the pin 114 may extend beyond an end of the left side (as well as a surface of the bottom side) of the electronics module 100.

The latch 110 may be mounted to the electronics module 100 via one or more recesses 118 formed in one or more sides of the electronics module 100. In some embodiments, the recess 118 may define an opening (not shown) in the top or bottom side of the electronics module 100. The pin 114 may be inserted through the opening such that the pin 114 extends into the recess 118 and is secured to a spring 120. The latch body 112 may be secured to the pin 114 using on or more fasteners 121 that extend through the latch body 112 and the pin 114. By coupling to the spring-biased pin 114 in such a manner, the latch body 112 may be moved up and down by pushing the latch body 112 in a direction that is against a direction of the spring force and by releasing the latch body 112 to allow the spring force to return the latch body 112 to an initial (engaged) position.

In some embodiments, the distal end 116 of the pin 114 is tapered in a rearward direction such that the pin 114 is biased inward into the electronics module 100 upon contacting a surface of another electronics module until the pin 114 is aligned with a pin-receiving receptacle (such as pin-receiving receptacle 132 shown in FIGS. 9 and 10) of the another electronics module. For example, as the tapered distal end 116 of the pin 114 contacts a top surface of the other electronics module 100.

The latch body 112 may also include a hook feature 122 that extends rearward from the rear surface. The hook feature 122 includes an interior portion 124 that is configured to latch onto a corresponding catch mechanism (such as catch mechanism 130 shown in FIG. 8) on another electronics module. The latch body 112 may have a thick portion and/or a thin portion. For example, a main portion of the latch body 112 may be thicker, with a large portion of the thickness being received within the recess 118. The hook feature 122 may be thinner such that the hook feature does not extend far beyond the surface of the left side. In some embodiments, a rear surface 126 of the hook feature 122 is angled such that upon slidingly contacting the corresponding catch feature, the corresponding catch mechanism pushes the dual-purpose latch 122 into a disengaged position until the corresponding catch mechanism engages the interior 124 of the hook feature 122.

The latch body 112 may also include a tab 128 that extends from the front surface of the latch body 112. The tab 128 is graspable by a user to lift the dual-purpose latch 110 to move the dual-purpose latch 110 between an engaged position and a disengaged position. The latch 110 is biased to stay in the engaged position by the spring-biased pin 114 as shown in FIG. 6. The latch 110 remains in the engaged position except when being actuated. When mounted on the electronics module 100 as shown, in the engaged position, the latch 110 is lowered such that the distal end 116 of the pin 114 extends from the opening beyond the bottom surface of the electronics module 100 such that the distal end 116 of the pin 114 is seatable within a corresponding pin-receiving receptacle formed in another electronics module housing or the hook feature 122 is in a position to engage the corresponding catch mechanism of the another electronics module housing. It will be appreciated that in some embodiments the latch 110 may be mounted in an opposite orientation, such that the latch 110 is in a raised position and the distal end 116 of pin 114 extends above the top surface of the electronics module 100.

In the disengaged position, as shown in FIG. 7, the distal end 116 of pin 114 is drawn entirely or partially within the channel such that the distal end 116 does not extend beyond the bottom (or top) surface of the electronics module 100 so as to not contact any portion of another electronics module. The hook feature 122 is moved to a position to receive or release the corresponding catch feature, such as by raising a tip of the hook feature 122 above a height of the corresponding catch feature.

Figure 8:
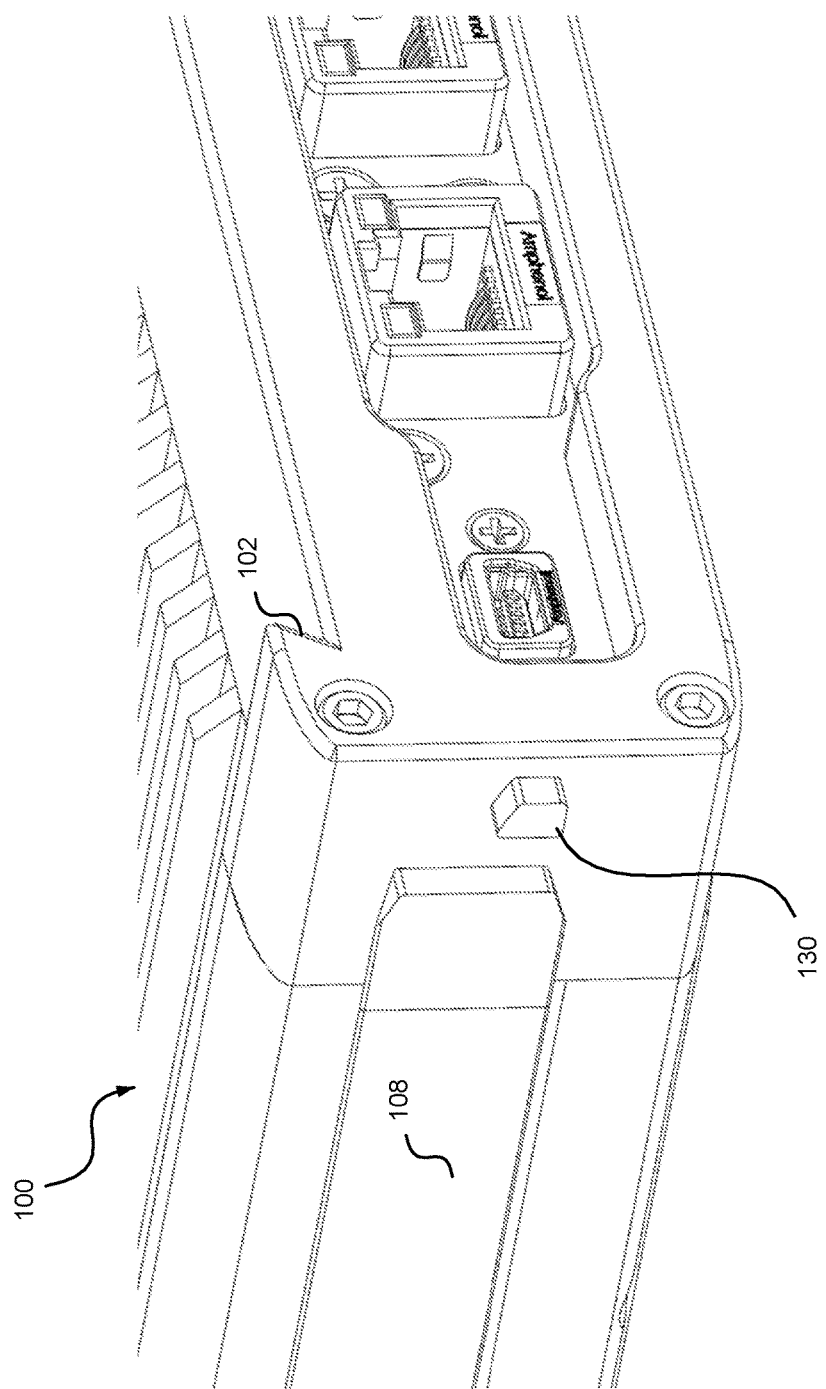
FIG. 8 depicts a catch mechanism formed on a side of the electronics module of FIG. 1.

As discussed above, each electronics module 100 may define a catch mechanism 130 that extends out from a side surface of the electronics module 100 as shown in FIG. 8. Catch mechanism is sized and shaped to be received in the interior 124 of a hook feature 122 of another electronics module 100. Catch mechanism 130 is positioned on an opposite side of the electronics module 100 as the dual-purpose latch 110 such that the catch mechanism 130 can interface with a latch of another electronics module 100 when engaged with the other electronics module 100. In some embodiments, the catch mechanism 130 may be positioned beyond an end of the dovetail feature 108 near an end of the right side of the electronics module 100, while in other embodiments, the catch mechanism 130 may be positioned at a medial position along the right side. While shown being centered along a thickness of the electronics module 100, catch mechanism 130 may be positioned at any height of the electronics module 100.

Figure 9:
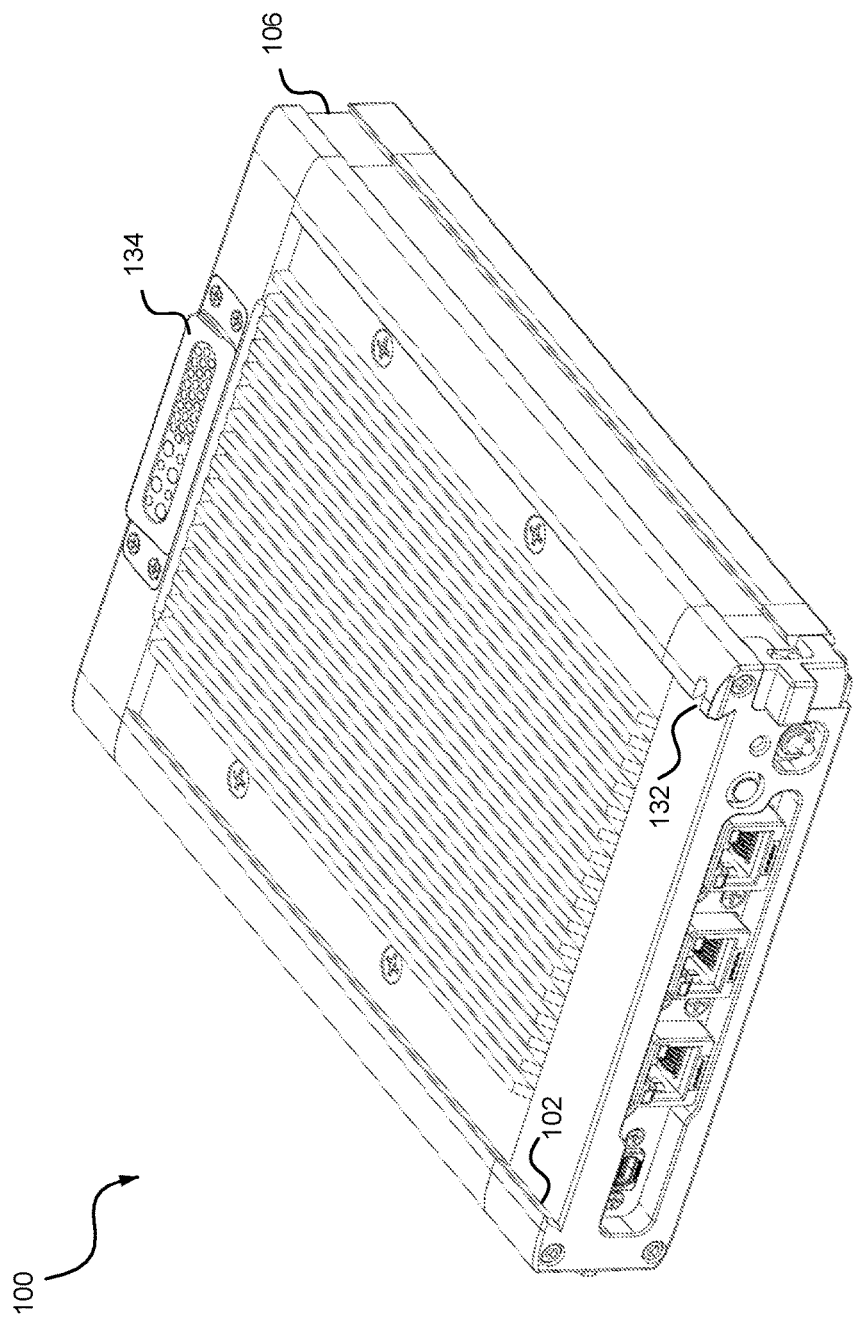
FIG. 9 depicts a pin-receiving receptacle formed on a top of the electronics module of FIG. 1.
Figure 10:
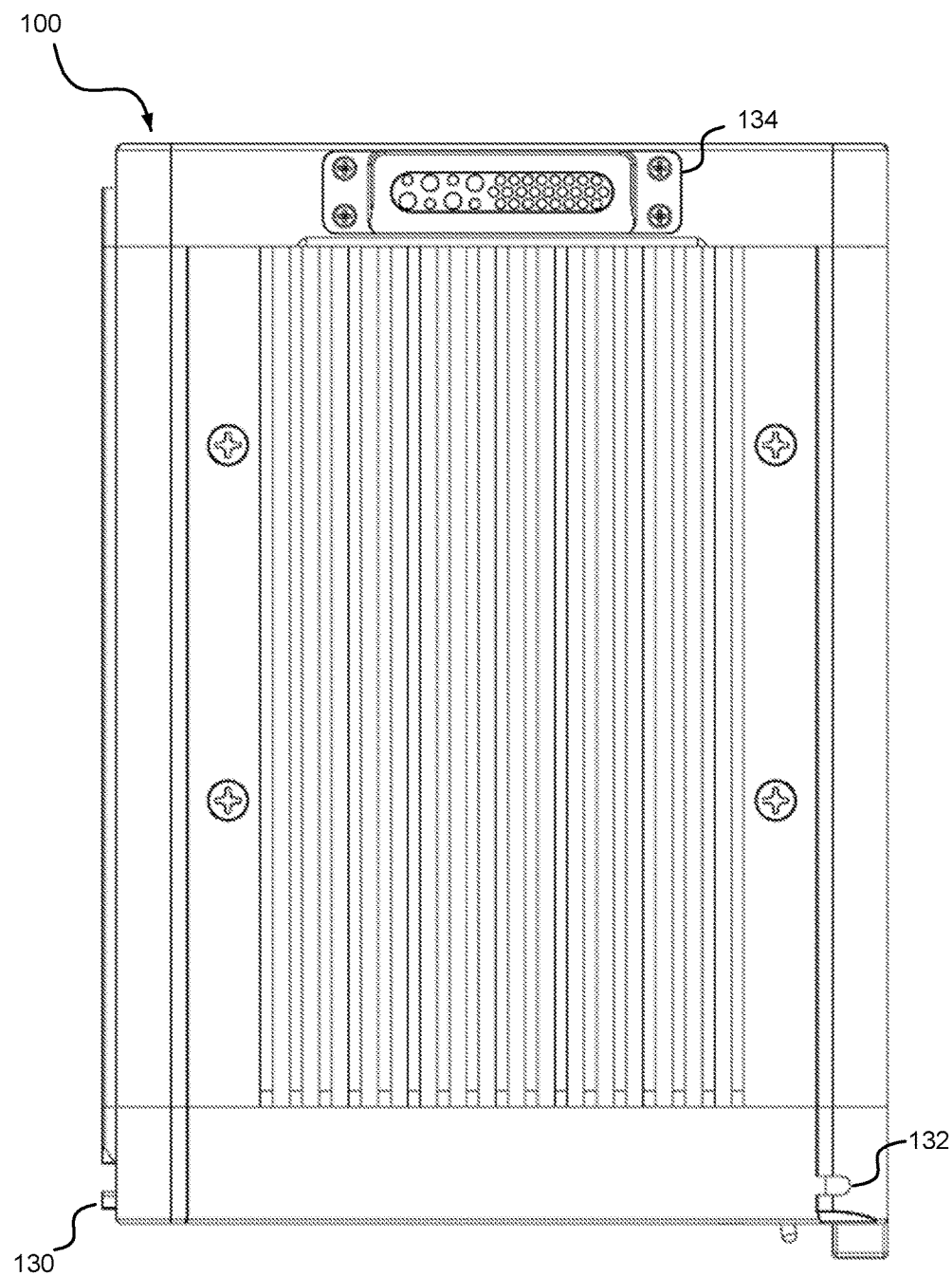
FIG. 10 is a top view depicting the pin-receiving receptacle formed on the top of the electronics module of FIG. 1.

FIGS. 9 and 10 depict a pin-receiving receptacle 132 according to embodiments. Pin-receiving receptacle 132 is positioned on a surface opposite and in alignment with the pin 114. For example, the latch 110 may be positioned on a front portion of the left side of the electronics module 100 such that the spring-loaded pin 114 extends through a portion of the front left corner of the electronics module 100. The pin-receiving receptacle 132 may then be positioned on the front left corner of the top side in alignment with the spring-loaded pin 114. While shown in this position, it will be appreciated that the latch 110 and pin-receiving receptacle 132 may be positioned at any other position near a periphery of the electronics module 100. The pin-receiving receptacle 132 extends at least partway through the thickness of the electronics module 100 and provides a seat for a spring-loaded pin 114 of another electronics module 100, with the seat having at least a front and a back wall or stop to prevent the pin 114 from moving out of the pin-receiving receptacle 132.

Figure 11:
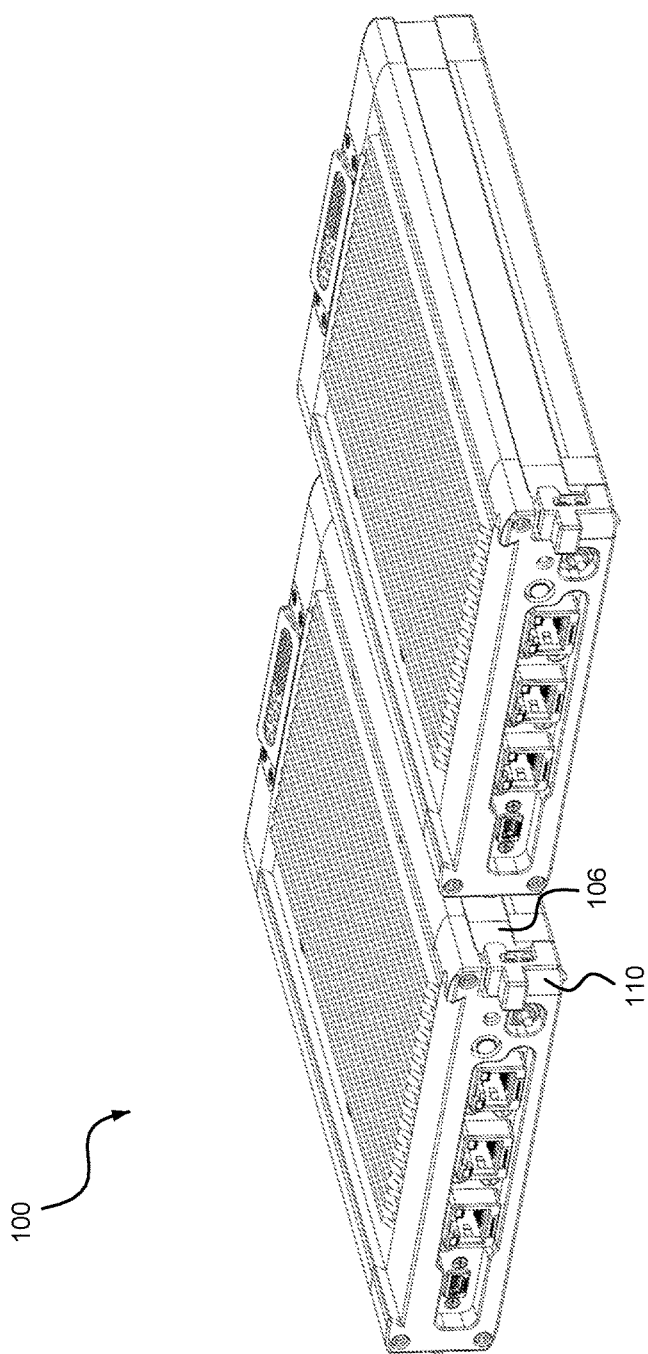
FIG. 11 depicts two electronics modules in a partially engaged side-by-side arrangement according to embodiments.

FIG. 11 shows a pair of electronics modules 100 being engaged in a side-by-side arrangement. Here, the dovetail feature 108 of a first electronics module 100 is being inserted into the recess 106 of a second electronics module 100 such that the right side of the first electronics module 100 is coupled with the left side of the second electronics module 100. For example, a front of the dovetail feature 108 is inserted into a rear of the recess 106. The electronics modules 100 are slid relative to one another to bring the dovetail feature 108 of the first electronics module 100 forward relative to the second electronics module such that the electronics modules 100 are in side-by-side alignment with one another.

Figure 12:
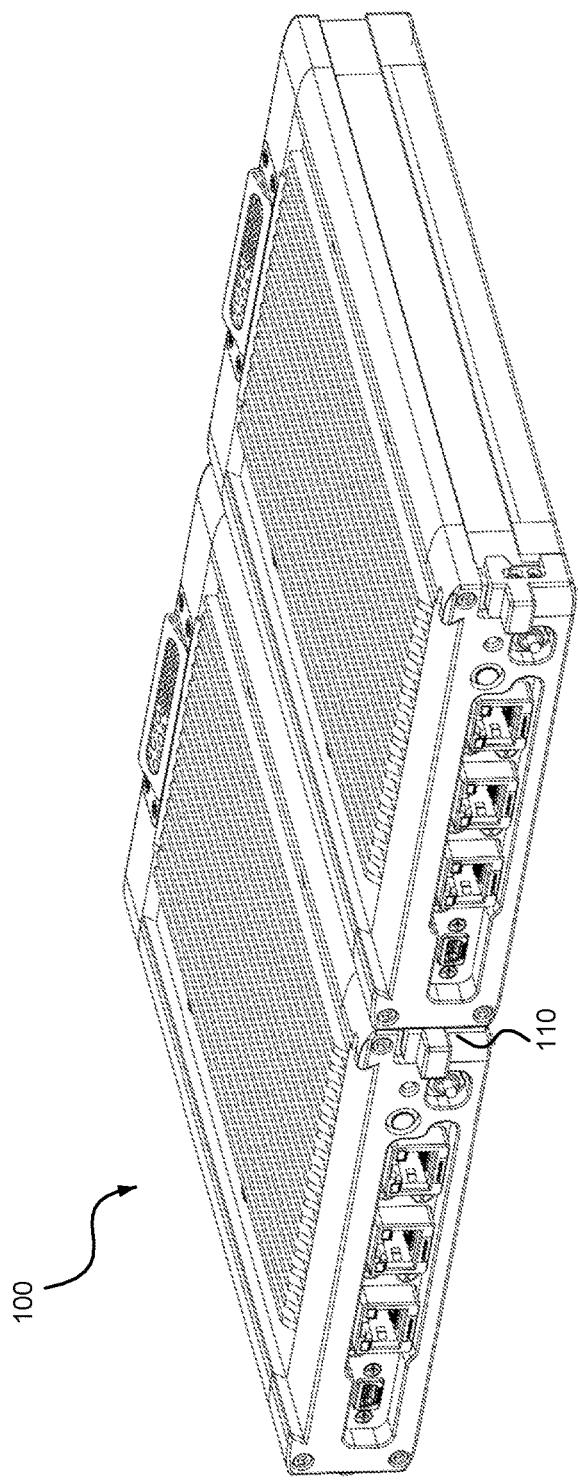
FIG. 12 depicts two electronics modules in a fully engaged side-by-side arrangement according to embodiments.

Once in alignment, as shown in FIG. 12, the latch 110 of the second electronics module 100 engages with the catch mechanism 130 of the first electronics module 100 to secure the modules together. Between the interface between the catch mechanism 130 and the latch 110 and the interface between the dovetail feature 108 and the recess 106, the electronics modules 100 are prevented from moving relative to one another in three dimensions. In some embodiments, to secure the latch 110 with the catch mechanism 130, a user must apply upward force to tab 128 to raise a tip of the hook feature 122 of latch 110 above a height of the catch mechanism 130. In other embodiments, where a rear side 126 of the hook feature 122 is tapered, the sliding of the electronics modules 100 relative to one another while the dovetail feature 108 is engaged with the recess 106 may cause the catch mechanism 130 to contact the tapered rear side 126, thereby pushing the latch 110 upward until the catch mechanism 130 engages the interior 124 of the hook feature 122, at which point the spring force causes latch 110 to snap back downward to secure the latch 110 with the catch mechanism 130.

To uncouple the electronics modules 100, the latch 110 may be forced upward against the spring force to release the catch mechanism 100 from the interior 124 of the hook feature 122 and the electronics modules 100 may be slid in an opposite direction to draw the dovetail feature 108 out of the recess 106.

Figure 13:
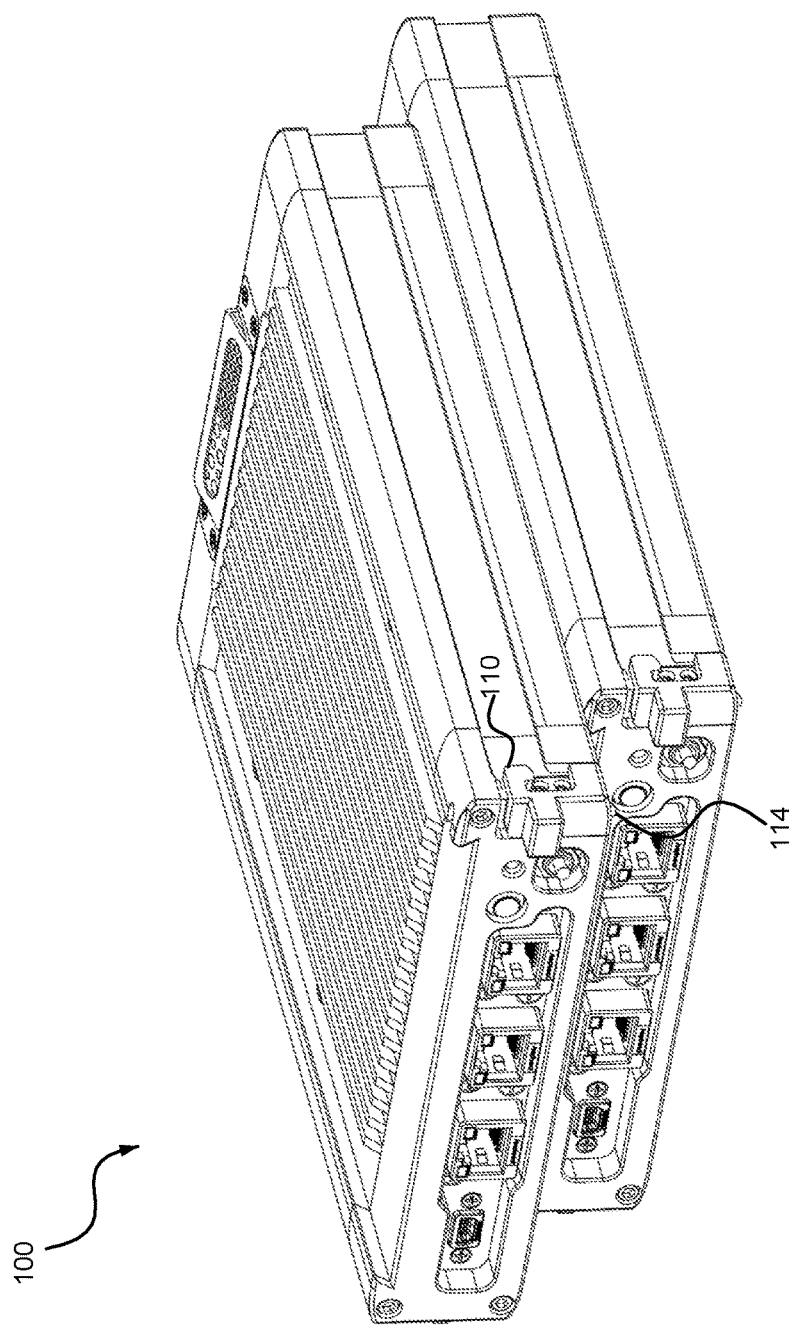
FIG. 13 depicts two electronics modules in a partially engaged vertical stack arrangement according to embodiments.
Figure 14:
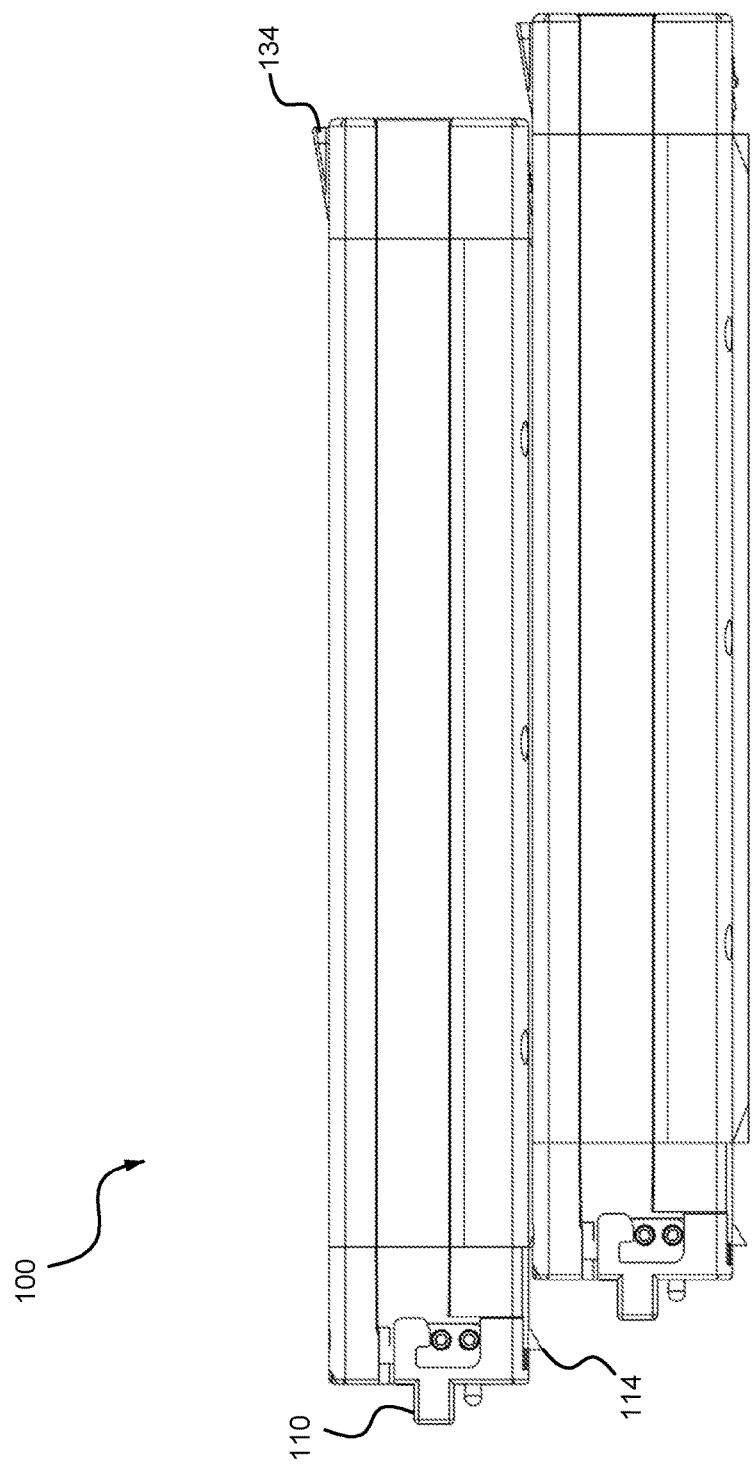
FIG. 14 depicts two electronics modules in a partially engaged vertical stack arrangement according to embodiments.

FIGS. 13 and 14 depict a pair of electronics modules 100 being engaged in a vertical stacking side arrangement. Here, the dovetail feature 104 of a first electronics module 100 is being inserted into the recess 102 of a second electronics module 100 such that the bottom side of the first electronics module 100 is coupled with the top side of the second electronics module 100. For example, a rear of the dovetail feature 104 is inserted into a front of the recess 102. The electronics modules 100 are slid relative to one another to bring the dovetail feature 104 of the first electronics module 100 rearward relative to the second electronics module such that the electronics modules 100 are in a vertical stacked alignment with one another.

Figure 15:
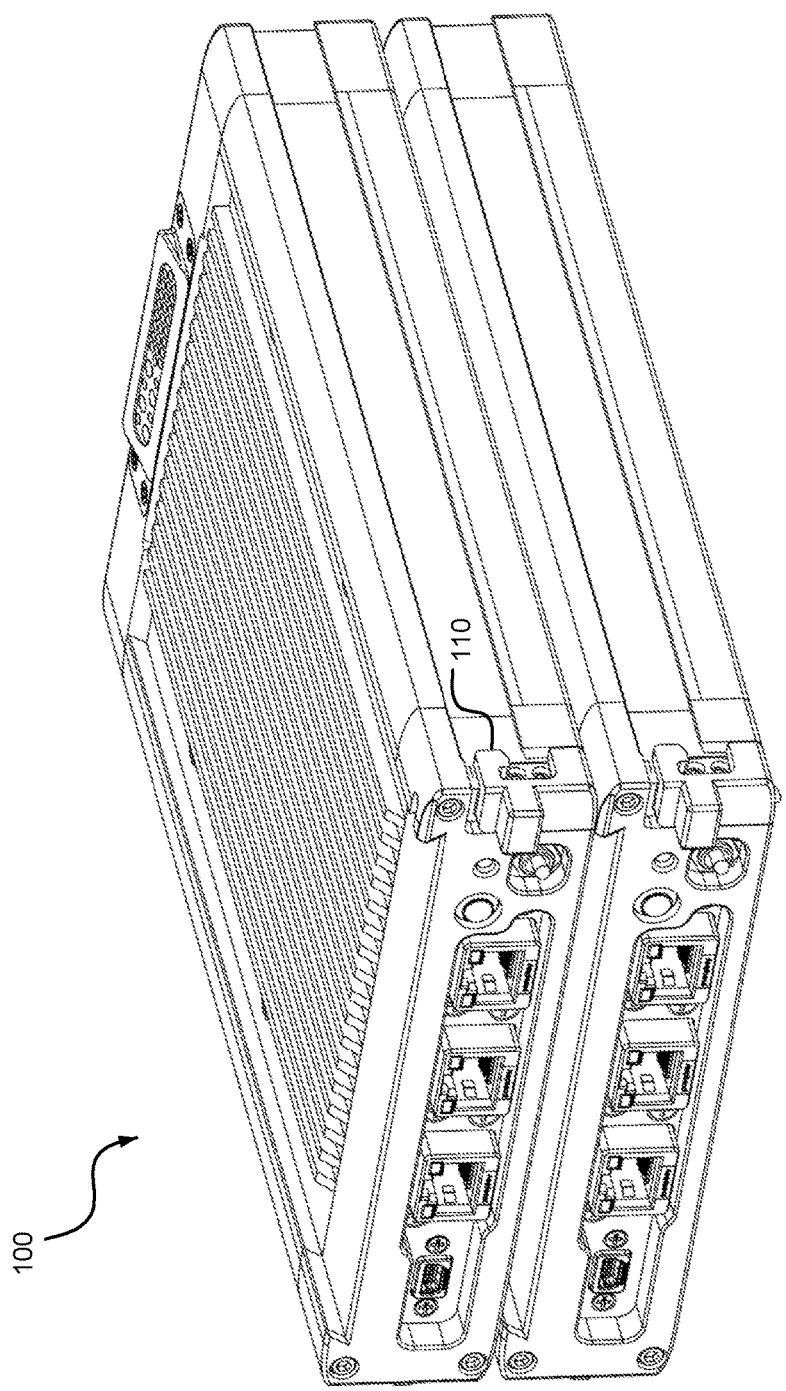
FIG. 15 depicts two electronics modules in a fully engaged vertical stack arrangement according to embodiments.
Figure 16:
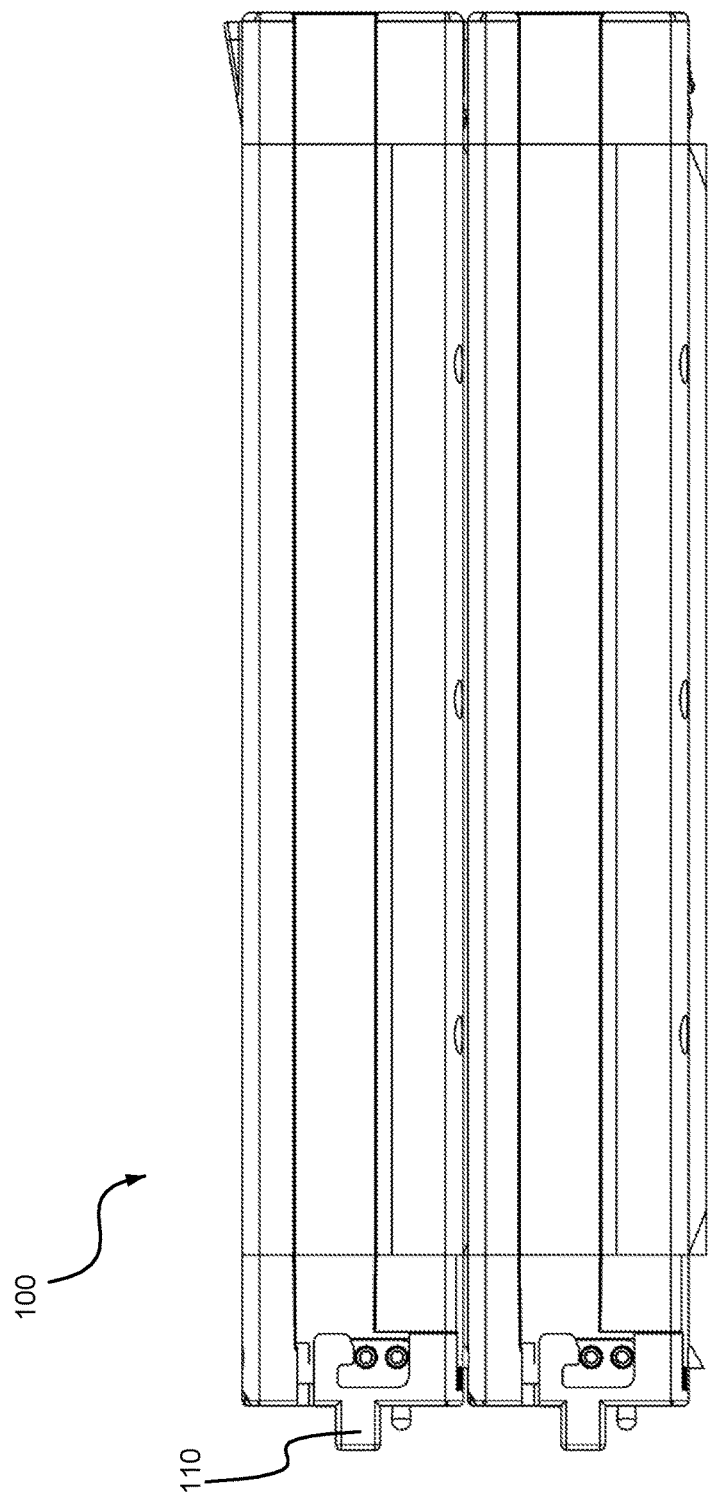
FIG. 16 depicts two electronics modules in a fully engaged vertical stack arrangement according to embodiments.

Once in alignment, as shown in FIGS. 15 and 16, the distal end 116 of the pin 114 of latch 110 of the second electronics module 100 engages with the pin-receiving receptacle 132 of the first electronics module 100 to secure the modules together. Between the interface between the pin-receiving receptacle 132 and the distal end 116 of pin 114 and the interface between the dovetail feature 104 and the recess 102, the electronics modules 100 are prevented from moving relative to one another in three dimensions. In some embodiments, to secure the distal end 116 of the pin 114 with the pin-receiving receptacle 132, a user must apply upward force to tab 128 to raise the distal end 116 of the pin 114 of latch 110 above a height of the top surface of the pin-receiving receptacle 132. In other embodiments, where a rear side of the distal end 116 of the pin 114 is tapered, the sliding of the electronics modules 100 relative to one another while the dovetail feature 104 is engaged with the recess 102 may cause the tapered distal end 116 to contact the top side of the first electronics module 100, thereby pushing the latch 110 upward until the distal end 116 engages the pin-receiving receptacle 132, at which point the spring force causes the distal end 116 to snap back downward into the pin-receiving receptacle 132 to secure the latch 110 with the pin-receiving receptacle 132.

To uncouple the electronics modules 100, the latch 110 may be forced upward against the spring force to release the distal end 116 of the pin 114 from the pin-receiving receptacle 132 and the electronics modules 100 may be slid in an opposite direction to draw the dovetail feature 104 out of the recess 102.

Figure 17:
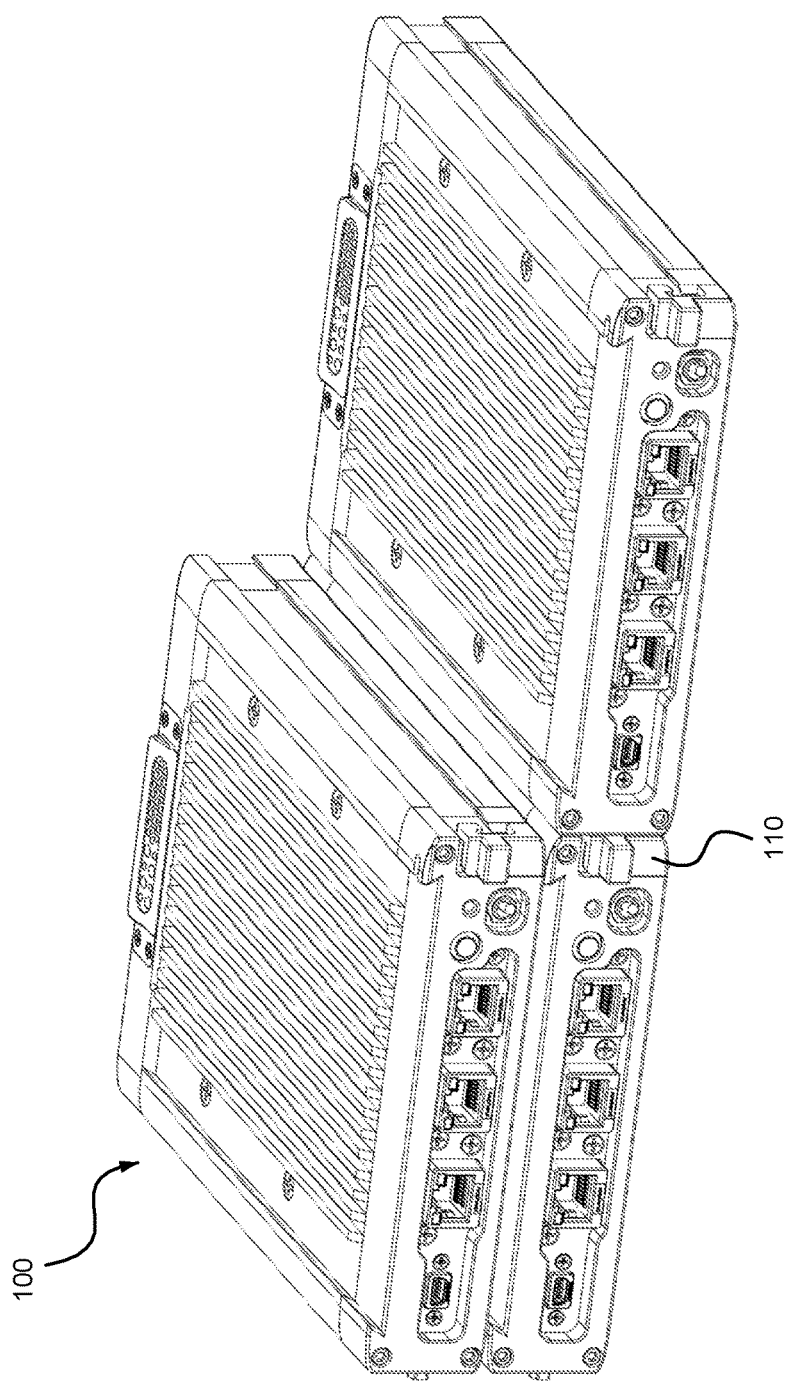
FIG. 17 depicts three electronics modules in a fully engaged vertical stack arrangement and side-by-side arrangement according to embodiments.

In some embodiments, an electronics module 100 may be stacked with at least one other electronics module 100 and coupled in a horizontal side-by-side arrangement with another electronics module 100. FIG. 17 shows a first electronics module 100 that uses its single latch 110 to secure the first electronics module 100 with both a second electronics module 100 that is stacked vertically atop the first electronics module 100 and a third electronics module 100 that is coupled in a side-by-side arrangement with the first electronics module 100. Such a configuration allows the functionality of the dual-purpose latch 110 to be maximized, as both the spring-biased pin 114 and the hook feature 122 are used to each secure a respective electronics module 100 to the first electronics module 100. While shown here with only three electronics modules 100 coupled together, it will be appreciated that any number of electronics modules 100 may be coupled together, with each respective dual-purpose latch 110 being used to secure zero, one, or two electronics modules 100 together in any desired arrangement.

By using a single latch on a single side of an electronics module 100 in the manner described above, any number of electronics modules may be securely coupled together in a vertical stack and/or side-by-side arrangement, eliminating the need for multiple latches or other coupling mechanisms or without the need for additional coupling mechanism. While shown with the latch 110 on the left side of the electronics module 100, it will be appreciated that the latch 110 may be positioned on the left side, right side, top side, and/or bottom side of the electronics module 100, with the catch mechanism 130 and pin-receiving receptacle 132 being positioned based on the selected position of the latch 110. Additionally, various combinations of mating features, the latch 110, the catch mechanism 130, and the pin-receiving receptacle 132. For example, while shown with the catch mechanism 130 being on a same side of electronics module as dovetail feature 108, it will be appreciated that the catch mechanism 130 may instead be on the same side as the recess 106. As another example, the latch 110 is shown on the same side of the electronics module 100 as recess 102, but may instead be on the same side as the dovetail feature 108.

In some embodiments, not only do the electronics modules 100 need to be physically coupled with one another, but they must also be electrically coupled with one another. In such embodiments, to eliminate the need for external wiring, one or more external connectors may be provided to transmit power and/or communicatively couple multiple electronics modules, in the vertical stacked arrangement and/or in the horizontal side-by-side arrangement. In many applications these couplings need to be sealed from the environment, which involves sealing the connections from dust, rain, and other elements. Embodiments of the present invention provide environmentally sealed connection solutions.

Figure 18:
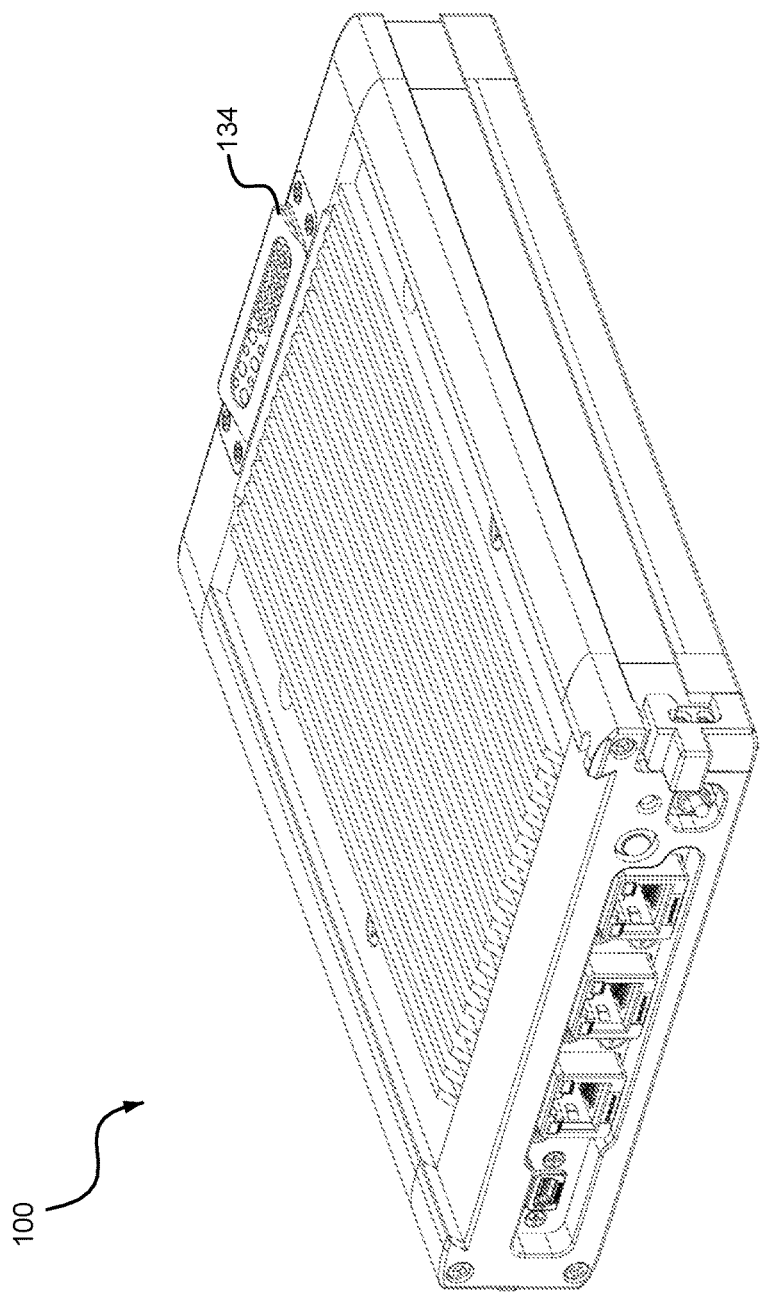
FIG. 18 depicts a top surface of the electronics module of FIG. 1 with a top electrical connector.
Figure 20:
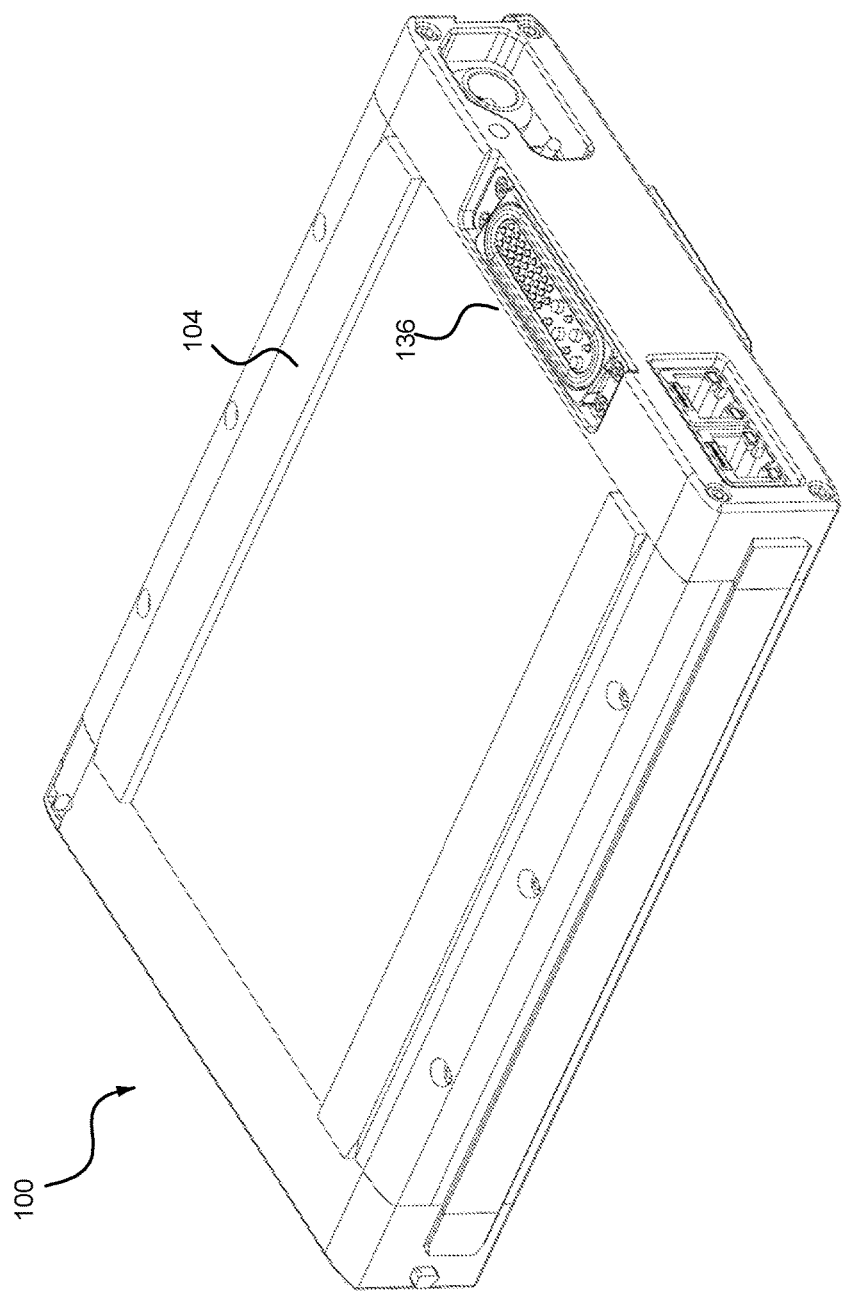
FIG. 20 depicts a bottom surface of the electronics module of FIG. 1 with a bottom electrical connector.

Electronics modules 100 may include a first electrical connector 134 positioned on a first side of the electronics module 100 and a second electrical connector 136 positioned on an opposite, second side of the electronics module 100, with the electrical connectors being configured to electrically couple with one another. For example, the first electrical connector 134 may be positioned on a top side of the electronics module 100 as shown in FIG. 18 the second electrical connector 136 may be positioned on a bottom side of the electronics module 100 (as shown in FIG. 20). It will be appreciated that in some embodiments the electrical connectors may be positioned on the left side and the right side of the electronics module 100, respectively. In other embodiments, the electronics module may include at least one electrical connector on each of the left side, right side, top side, and bottom side, with opposing connectors being configured to electrically couple with one another. In some embodiments, at least one pair of opposing sides of the electronics module 100 may include multiple electrical connectors.

The first electrical connector 134 may include a mounting seat 138 that extends around a connector element, such as electrical pin or receptacles. The mounting seat 138 may be sloped at an angle relative to the side of the electronics module 100. For example, as shown here, mounting seat 138 may be elevated from front to back at an angle of between about 5 and 20 degrees, with angles of about 10 degrees being most common. While shown here as extending across only a small portion (10-30%) of the width of the electronics module 100, it will be appreciated that in some embodiments, smaller or larger electrical connectors may be used. Additionally, in some embodiments, the electrical connector 134 may be offset from a center of the electronics module 100, instead of aligned with the center as shown here. The mounting seat 138 may be formed into the electronics module 100 or may be fastened to the electronics module 100 using mechanical fasteners, adhesives, and/or other securement techniques.

Figure 19:
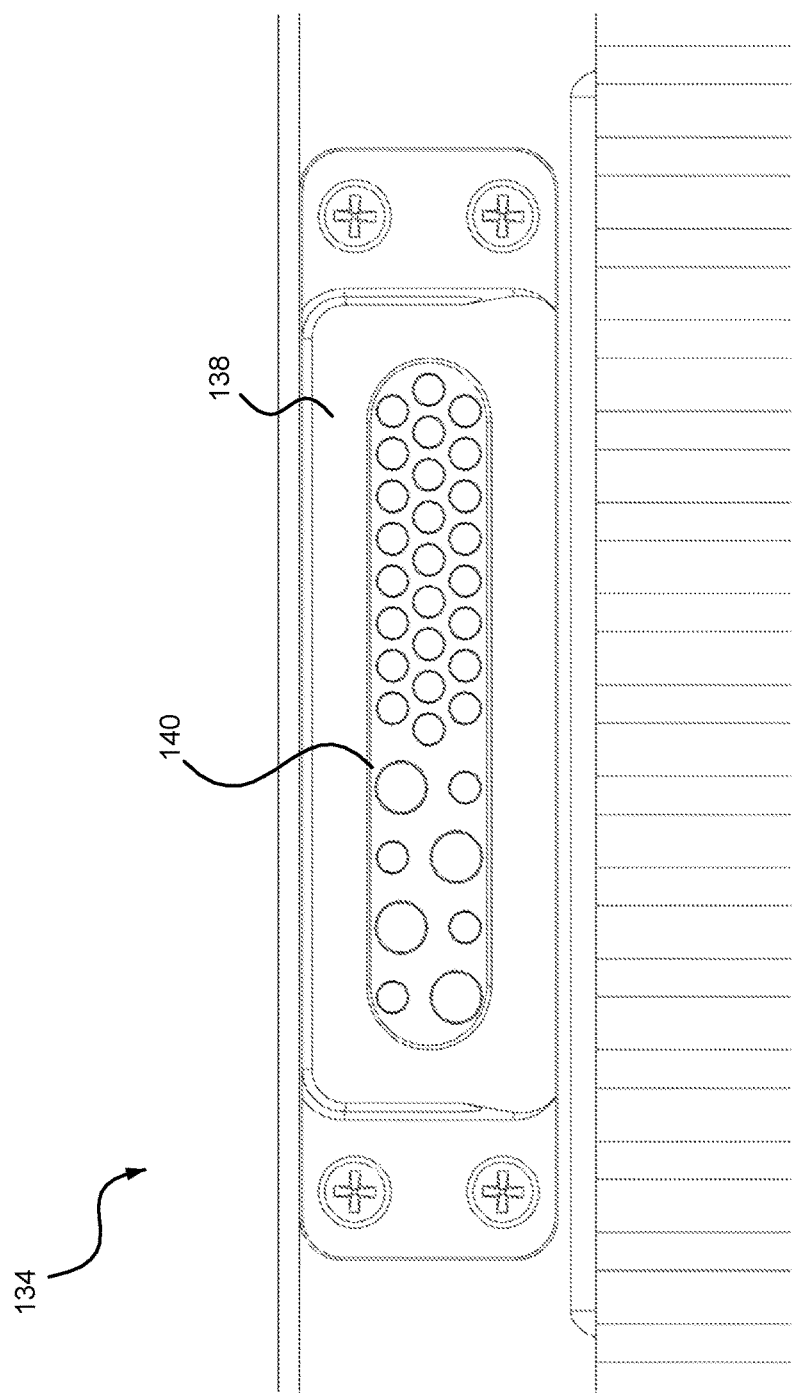
FIG. 19 is a top view of the top electrical connector of FIG. 18.

As shown in FIG. 19, first electrical connector 134 may define a plurality of pin-receiving receptacles 140. Pin-receiving receptacles 140 may be positioned within the mounting seater 138 and may be configured to receive a number of pins from a connector on another electronics module 100. In some embodiments, the receptacles 140 may have a uniform size, shape, and/or distribution within the mounting seat 138, while in other embodiments, the size, distribution, and shape and/or receptacles 140 is varied, as seen in the illustrated embodiment. Receptacles 140 may be provided at an angle relative to the electronics module 100. For example the receptacles 140 may be angled in such a manner that the receptacles 140 remain generally orthogonal (within 5 degrees) to the exposed surface of mounting seat 138. For example, if the mounting seat 138 is elevated relative to the upper side of the electronics module 100 at an angle of 10 degrees, then the receptacles 140 may be angled at 90 degrees relative to the mounting seat 138, which equates to 80 degrees relative to the top side of the electronics module 100. In other words, in some embodiments, the angle between the mounting seat 138 and the top side of electronics module 100 and the angle between a longitudinal axis of the receptacles 140 and the top side of the electronics module 100 may be complementary to one another.

As shown in FIG. 20, the second electrical connector 136 may be very similar to the first electrical connector 134. For example, the second electrical connector 136 may include a mounting seat 142 that extends around a connector element, such as electrical pin or receptacles. The mounting seat 142 may be sloped at an angle relative to the side of the electronics module 100, with the slope being oriented in an opposite direction as the slope of the first electrical connector 134. For example, in the illustrated embodiment, mounting seat 142 may be elevated from back to front at an angle that matches the angle of elevation of the mounting seat 138 from front to back of between about 5 and 20 degrees, with angles of about 10 degrees being most common. Mounting seat 142 is sized and shaped to correspond with mounting seat 138, with one main difference being that mounting seat 142 is oriented in an opposite direction than mounting seat 138. The position of the mounting seat 142 relative to the electronics module 100 is mirrored relative to the position of the mounting seat 138 such that one of the mounting seats is angled upward and one of the mounting seats is angled downward, with one of the mounting seats facing a rear of the electronics module 100 and the other mounting seat facing a front of the electronics module 100. The mounting seats are also positioned directly opposite one another on opposing faces of the electronics module 100. This allows a number of electronics modules 100 to be produced with the design such that when slidingly coupled together using one or more of the mating/engagement features described above, the mounting seats engage with one another to create a flush interface there between.

Figure 21:
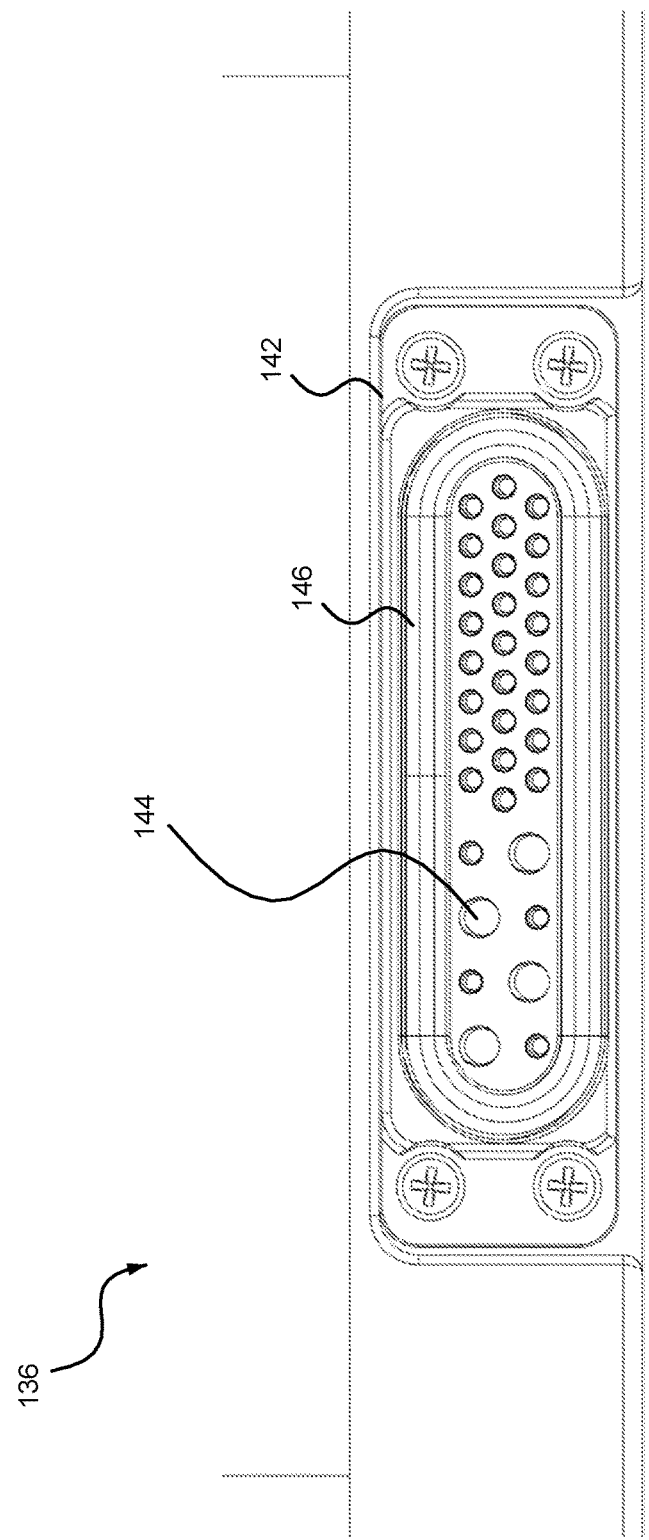
FIG. 21 is a bottom view of the bottom electrical connector of FIG. 20.

As shown in FIG. 21, second electrical connector 136 may define a plurality of spring loaded pins 144. Pins 144 may be positioned within the mounting seat 142 and may be configured to be inserted within a number of corresponding receptacles of a connector on another electronics module 100. For example, the pins 144 from a first electronics module 100 may be interfaced with the receptacles 140 on a second electronics module 100. In some embodiments, the pins 144 may have a uniform size, shape, and/or distribution within the mounting seat 142, while in other embodiments, the size, distribution, and shape and/or pins 144 is varied, as seen in the illustrated embodiment. Pins 144 may be provided at an angle relative to the electronics module 100. For example the pins 144 may be angled in such a manner that the pins 144 remain generally orthogonal (within 5 degrees) to the exposed surface of mounting seat 142. For example, if the mounting seat 142 is elevated relative to the upper side of the electronics module 100 at an angle of 10 degrees, then the pins 144 may be angled at 90 degrees relative to the mounting seat 142, which equates to 80 degrees relative to the top side of the electronics module 100. In other words, in some embodiments, the angle between the mounting seat 142 and the top side of electronics module 100 and the angle between a longitudinal axis of the pins 144 and the top side of the electronics module 100 may be complementary to one another.

Figure 22:
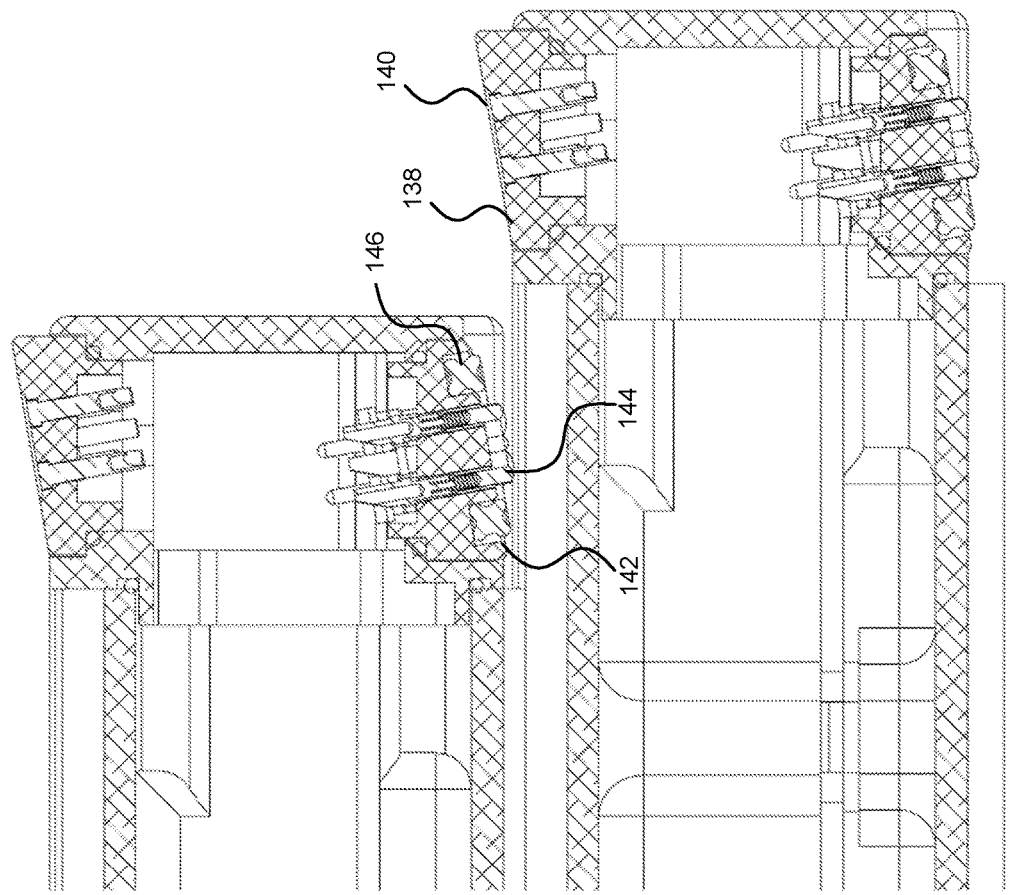
FIG. 22 depicts two electronics modules in a partially engaged vertical stack arrangement according to embodiments.

To further enhance the environmental sealing ability of the electronics module 100, one or more gaskets 146 may be positioned on or near one or more of the mounting seats. For example, in the illustrated embodiment, the mounting seat 142 includes a gasket 146 that extends beyond an exposed surface of the mounting seat 142. Gasket 146 may be positioned within a recess or channel (not shown) that is defined within or around the mounting seta 142. Gasket 146 may be formed of rubber and/or other natural or synthetic sealing material and may encircle all of the pins 144 and/or receptacles 140 disposed within the interior of the mounting seat 142. Oftentimes, gasket 146 has an x-shaped cross section, as best seen in FIG. 22. The x-shaped cross section helps prevent gasket 146 from rolling or twisting as another mounting seat slides over the gasket 146, although other cross-sectional shapes, such as circles, ellipses, rectangles, triangles, and the like may be used. In the present embodiment, the gasket 146 is stadium shaped, however other shapes may be contemplated based on the shape of the mounting seat 142 and the arrangement of pins 144 and/or receptacles 142. Gasket 146 may be positioned on one or both of mounting seat 138 or mounting seta 142, although it may be advantageous to position the gasket 146 on the mounting seat that includes pins 144, as this prevents the pins 144 from one electronics module 100 from scraping against the gasket 146 of another electronics module 100 as the respective mounting seats are interfaced with one another.

Figure 23:
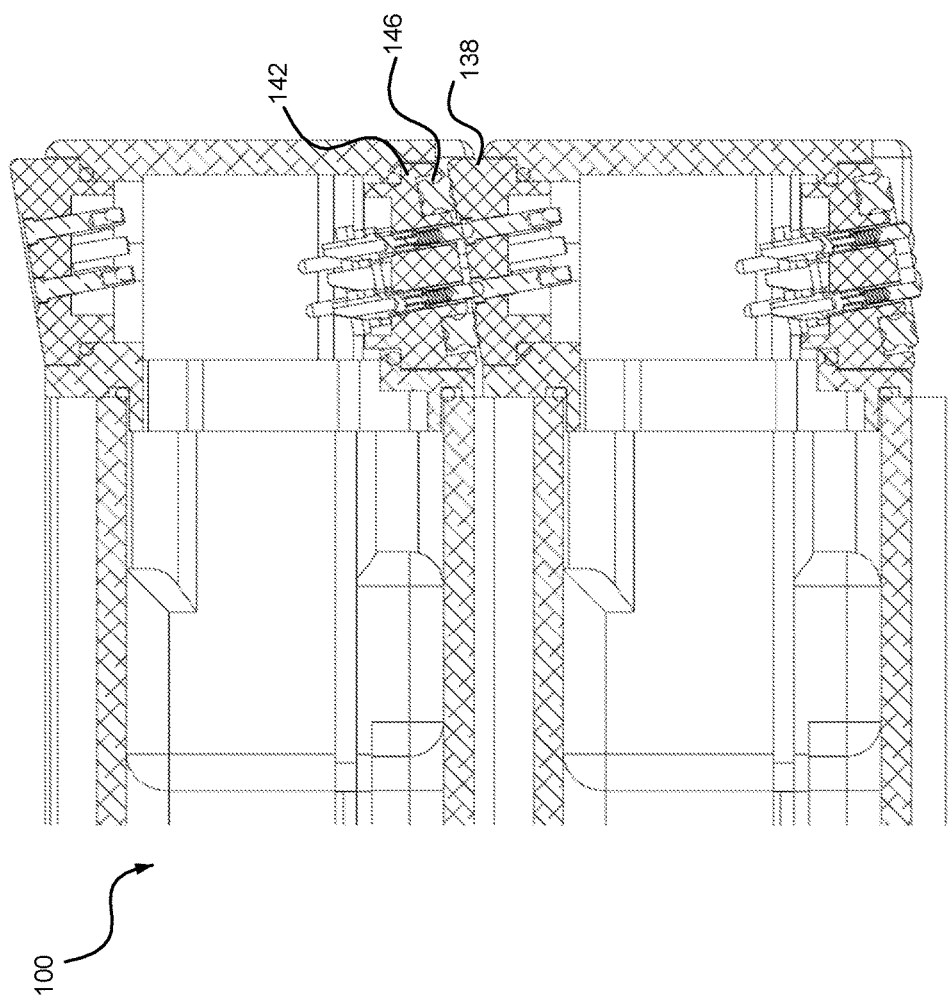
FIG. 23 depicts two electronics modules in a fully engaged vertical stack arrangement according to embodiments.

FIG. 22 shows a pair of electronics modules 100 being slidingly coupled with one another. For example a top electronics module 100 may have dovetail feature 104 engaged with the recess 102 of a bottom electronics module 100, with the dovetail feature 104 being slid rearward deeper into the recess 102. In the illustrated position, distal ends of each of the pins 144 of the electrical connector 136 extend beyond a bottom surface of the top electronics module 100 and may or may not contact a top surface of the bottom electronics module 100. Prior to interfacing the two mounting seats, the gasket 146 is in an uncompressed state. As the mounting seats contact one another, the pins 144 and gasket 146 are compressed inward by the opposing mounting seta 142. Once the mounting seats 138 and 142 are aligned, as shown in FIG. 23, the pins 144 of the first electronics module 100 at least partially decompress and inert into receptacles 140 of the second, lower electronics module 100. The gasket 146 is compressed between the two mounting seats on all sides to environmentally seal the connection. In embodiments, with the dual-purpose latch 110, once the connectors are aligned, the latch 110 may be used to secure the electronics modules 100 and respective interfacing electrical connectors with one another.

By using an angled design of the connectors, a gradual compression action is produced on the spring loaded pins 144, which allows the spring loaded pins 144 to be compressed during the swiping action of their connection without being damaged. The unique angle also allows the gasket 146 to create an environmental seal around the mated connection with minimal drag due to the swiping configuration. This results in minimal gasket wear and a reduced tendency for the gasket 146 to "roll" out of its mounting groove. The unique angle design also creates a compression force on the gasket 146 when the connection is fully seated even though its main connection is created during a swiping action.

The mounting seats extend beyond a surface of the electronics modules 100 in order to mate with the necessary flush, angled interface. The maximum height each mounting seat may extend beyond the surface may vary, but is limited by the height of the dovetail feature 104 or other mating features, as extending above this height would prevent the electronics modules 100 from being securely coupled with one another.

It will be appreciated that the above embodiments are merely a single example and that numerous variations may be contemplated. For example, while the electronics modules 100 shown have the forward facing electrical connector 134 on a top surface, it will be appreciated that in other embodiments this may be reversed. Similarly, while shown with pins 144 and gasket 146 on a bottom electrical connector 136, some embodiments may provide these on a top electrical connector 134. In some embodiments, a single connector may include both pins 144 and receptacles 140 and/or may utilize other types of electrical connection elements. Additionally, any combination of number and location of electrical connectors may be used on any sets of opposing sides of electrical modules 100 that may be secured adjacent one another.

Figure 24:
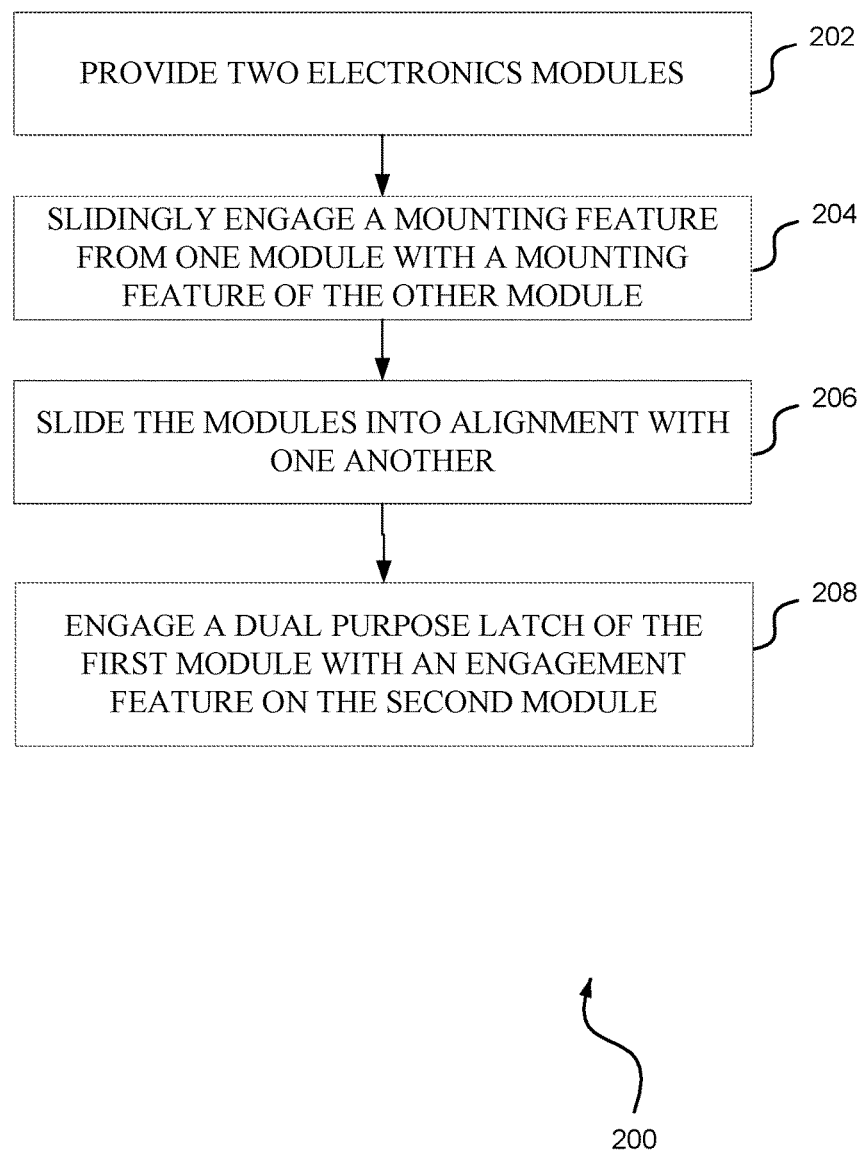
FIG. 24 is a flowchart of a method of coupling electronics modules according to embodiments.

FIG. 24 depicts a process 200 for coupling electronics modules. Process 200 may be performed using any number of electronics modules, such as electronics module 100. Process 200 may begin at block 202 by providing a first electronics module and a second electronics module. Each electronics module may be the same or similar to electronics module 100 described herein. For example, each electronics modules may include an electronics housing including a first side, a second side positioned opposite the first side, a third side extending in a generally orthogonal direction between the first side and the second side, and a fourth side parallel to and positioned opposite the third side. The electronics module defines an axis extending from a front to rear of the electronics module. Each of the sides may define a mating feature configured for sliding engagement with a corresponding mating feature of another electronics module in a direction that is parallel to the axis. For example, the mating features may include dovetail features and dovetail receiving recesses, such as dovetail features 104 and 108 and recesses 102 and 106.

Process 200, at block 204, may include engaging a mounting feature from one of the sides of the first electronics module with a corresponding mating feature from an opposite side of the second electronics module to constrain movement of the electronics modules relative to one another in two directions that are generally orthogonal to the axis. This may involve, for example, inserting a dovetail feature 104 of a first electronics module into a recess 102 of the second electronics module or inserting a dovetail feature 108 of the first electronics module into the recess of the second electronics module. At block 206, the first electronics module may be slid relative to the second electronics module in a direction that is generally parallel to the axis. The sliding may be done until an end of the dovetail feature contact an end of the channel such that the two electronics modules (and in embodiments with electrical connectors, the respective, adjacent connectors) are in alignment.

At block 206, process 200 involves engaging a dual-purpose latch of the first electronics housing with an engagement feature on the second electronics housing such that one of a hook feature or a spring biased pin of the dual-purpose latch constrains movement of the electronics modules relative to one another in a direction that is generally parallel to the axis, such as shown in FIGS. 12, 15, 16, and 17. For example, the spring-biased pin of the dual-purpose latch secures the electronics modules that are in the vertically stacked arrangement with one another while the hook feature of the dual-purpose latch secures the electronics modules that are in the horizontal side-by-side arrangement with one another.

In some embodiments, process 200 may include actuating the dual-purpose latch to move the dual-purpose latch to a disengagement position in which the one of a hook feature or a spring biased pin of the dual-purpose latch moves out of engagement with the engagement feature on the second electronics module, thereby enabling movement of the electronics modules relative to one another in a direction that is generally parallel to the axis. In some embodiments, the process 200 may also include coupling a third electronics module with the first electronics module such that both the hook feature and the spring biased pin of the latch of the first electronics module are used to couple electronics modules with the first electronics module, with one of the additional modules being stacked atop the first electronics module and another one secured to its side such as shown in FIG. 17. It will be appreciated that any number of electronics modules may be coupled in this fashion.

Figure 25:
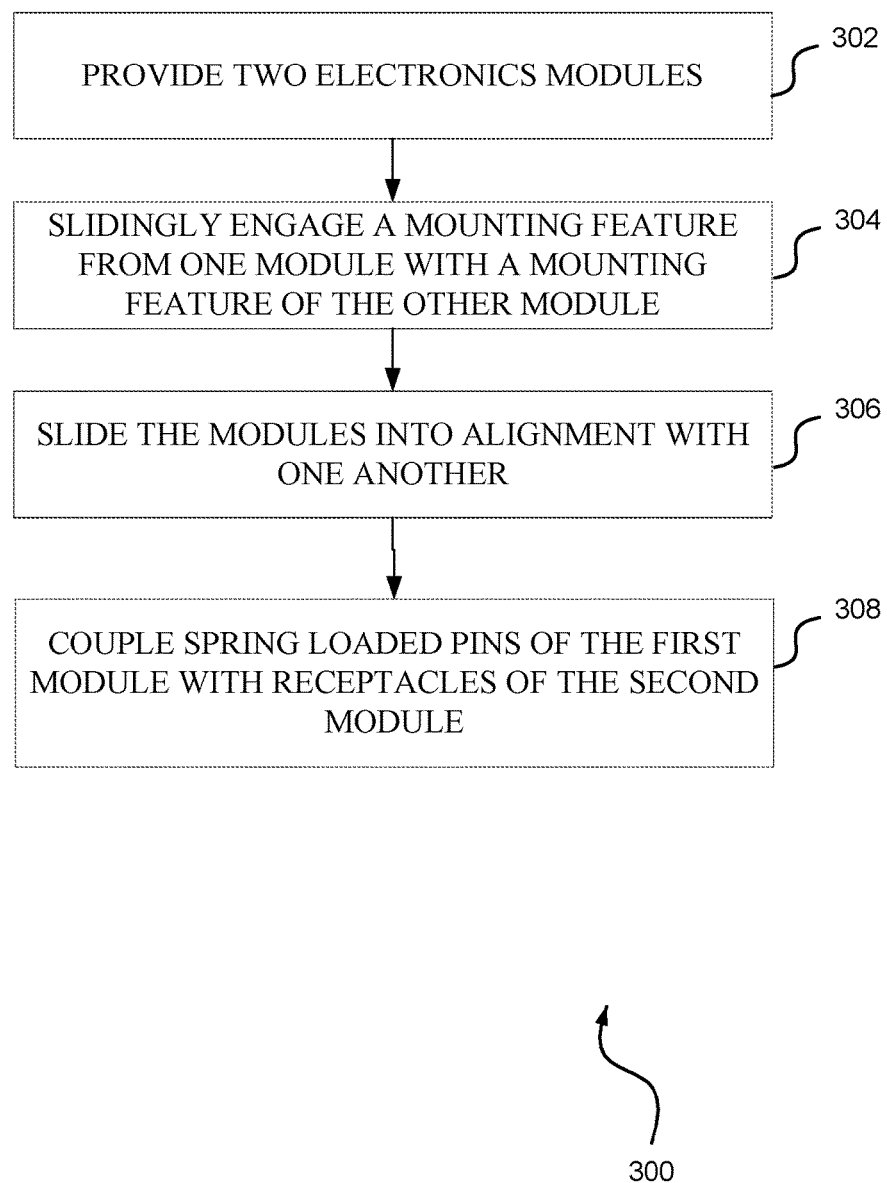
FIG. 25 is a flowchart of a method of coupling electronics modules according to embodiments.

FIG. 25 is a flowchart of a process 300 for coupling electronics modules together. Process 300 may be performed using electronics modules similar or the same as those electronics modules 100 described herein. For example, process 300 may begin at block 302 by providing a first electronics module and a second electronics module, which may be electronics modules 100. For example, the electronics modules may include an electronics housing including a first side, a second side positioned opposite the first side, a third side extending in a generally orthogonal direction between the first side and the second side, and a fourth side parallel to and positioned opposite the third side. The electronics modules may define an axis extending from a front to rear of the electronics module. Each of the sides defines a mating feature configured for sliding engagement with a corresponding mating feature of another electronics module in a direction that is parallel to the axis. For example, the mating features may include the dovetail features 104 and 108, dovetail-receiving recesses 102 and 106, and/or other sliding mating features.

At block 304, process includes engaging a mounting feature from one of the sides of the first electronics module with a corresponding mating feature from an opposite side of the second electronics module to constrain movement of the electronics modules relative to one another in two directions that are generally orthogonal to the axis. This may involve, for example, inserting a dovetail feature 104 of a first electronics module into a recess 102 of the second electronics module or inserting a dovetail feature 108 of the first electronics module into the recess of the second electronics module. At block 306, the first electronics module is slid relative to the second electronics module in a direction that is generally parallel to the axis. The sliding may be done until an end of the dovetail feature contacts an end of the channel such that the two electronics modules and electrical connectors of the modules are in alignment.

At block 308, process 300 involves coupling a plurality of spring loaded pins of a first angled electrical connector with a plurality of pin-receiving receptacles of a second angled electrical connector on the second electronics housing such that a first mounting seat of the first electronics module is positioned flush against the second mounting seat of the second electronics module so as to seal a connection between the plurality of spring-loaded pins and the plurality of pin-receiving receptacles from an outside environment. The first mounting seat and the second mounting seat are sloped at an angle relative to their respective electronics modules, such as an angle between about 5 and 20 degrees. The second mounting seat is sloped in an opposite direction as the first mounting seat with a similar magnitude of slope. For example, the first mounting seat may be sloped front to back at an angle of 10 degrees and the second mounting seat may be sloped back to front at an angle of 10 degrees. The plurality of spring-loaded pins are generally orthogonal relative to the first mounting seat. The plurality of spring-loaded pins are biased in an extended position. The plurality of pin receiving receptacles are generally orthogonal angle to the second mounting seat. Once coupled in this manner, a gasket is compressed between the two mounting seats to seal the electrical connections.

In some embodiments, process 300 includes engaging a locking mechanism that, in conjunction with the mating features, is configured to constrain movement of the electronics modules relative to one another in three dimensions to maintain a connection between the first angled electrical connector and the second angled electrical connector. For example, a dual-purpose latch, such as latch 110 may be used to secure the electronics modules and respective, adjacent connectors with one another. In some embodiments, a third electronics module may be coupled to the third side of the first electronics module such that a third angled electrical connector of the first electronics module is electrically coupled with a fourth angled electrical connector of the third electronics module. For example, the modules may be all vertically stacked, all horizontally side-by-side, and/or a mixture of both.

It will be appreciated that processes 200 and 300 may be performed together or separately, and may be used to both electrically and physically couple any number of electronics modules in any number of horizontal and/or vertical arraignments.

While disclosed with the electrical connector on the top side being sloped upward from front to back and the connector on the bottom side being sloped upward from back to front, it will be appreciated that these orientations may be reversed. Similarly, if electrical connectors are provided on left or right sides of the electronics modules, coupling the electrical connections may be done in a horizontal side-by-side arrangement.

The methods, systems, and devices discussed above are examples. Some embodiments were described as processes depicted as flow diagrams or block diagrams. Although each may describe the operations as a sequential process, many of the operations can be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It should be noted that the systems and devices discussed above are intended merely to be examples. It must be stressed that various embodiments may omit, substitute, or add various procedures or components as appropriate. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known structures and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

Also, the words "comprise", "comprising", "contains", "containing", "include", "including", and "includes", when used in this specification and in the following claims, are intended to specify the presence of stated features, integers, components, or steps, but they do not preclude the presence or addition of one or more other features, integers, components, steps, acts, or groups.

What is claimed is:

1. A bi-directional electronics module system, comprising:
   a first electronics module;
   a second electronics module, wherein each of the first electronics module and the second electronics module comprise:
   a housing that includes a first side, a second side positioned opposite the first side, a third side extending in a generally orthogonal direction between the first side and the second side, and a fourth side parallel to and positioned opposite the third side, wherein:
      the electronics housing defines an axis extending from a front to rear of the electronics module;
      each of the sides defines a mating feature configured for sliding engagement with a corresponding mating feature of another electronics module in a direction that is parallel to the axis;
      the first side further defines a pin-receiving receptacle;
      the third side further defines a recess extending partially through a width or a thickness of the electronics housing; and
      the fourth side comprises a catch mechanism; and
   a dual-purpose latch mounted at least partially within the recess, comprising:
      a latch body having a top surface, a bottom surface, a front surface, a rear surface, an inner side surface, and an outer side surface, wherein one of the bottom surface or the top surface defines an opening to a generally vertically oriented channel formed in the latch body;
      a hook feature extending rearward from the rear surface and configured to latch onto a corresponding catch mechanism on the another electronics module; and
      a spring-biased pin that is received within the channel and mounted within the recess such that a distal end of the pin extends from the opening beyond the one of the bottom surface or the top surface and beyond at least a portion of the second side of the electronics module;
   wherein:
      the first electronics module and the second electronics module are positionable in a locked stacked arrangement and a locked side-by-side arrangement in which relative movement between the first electronics module and the second electronics module is constrained in three dimensions;
      when in a first of the locked stacked arrangement or the locked side-by-side arrangement the spring-biased pin of the first electronics module is engaged with the pin-receiving receptacle of the second electronics module and mating features on respective adjacent sides of the first electronics module and the second electronics module are in sliding engagement with one another; and
      when in a second of the locked stacked arrangement or the locked side-by-side arrangement the hook feature of the first electronics module is engaged with the catch mechanism of the second electronics module and mating features on respective adjacent sides of the first electronics module and the second electronics module are in sliding engagement with one another.

2. The bi-directional electronics module system of claim 1, further comprising:
   a third electronics module, wherein the first electronics module is in the locked stacked arrangement with the second electronics module and is in the locked side-by-side arrangement with the third electronics module.

3. The bi-directional electronics module system of claim 1, wherein:
   each spring-biased pin enables the dual-purpose latch to slide between a disengaged position and an engaged position;
   in the disengaged position the pin and the hook feature are disengaged from the another electronics module; and
   in the engaged position the pin or the hook feature is engaged with the another electronics housing so as to constrain movement of the electronics module housing relative to the another electronics module housing in a direction that is generally parallel to the axis.

4. The bi-directional electronics module system of claim 3, wherein:
   each dual-purpose latch comprises a tab protruding from the front surface that is graspable by a user to lift the dual-purpose latch to move the dual-purpose latch to the disengaged position.

5. The bi-directional electronics module system of claim 1, further comprising:
   each dual-purpose latch is biased to stay in the engaged position except when being actuated.

6. The bi-directional electronics module system of claim 1, wherein:
   the distal end of each pin is tapered such that the pin is biased inward upon contacting a surface of the another electronics module until the pin is aligned with a pin-receiving receptacle of the another electronics module.

7. The bi-directional electronics module system of claim 1, wherein:
   each of the mating features comprises a dovetail or a dovetail-receiving channel formed on the another electronics module.

8. An electronics module having a dual-purpose latch, comprising:
   an electronics housing including a first side, a second side positioned opposite the first side, a third side extending in a generally orthogonal direction between the first side and the second side, and a fourth side parallel to and positioned opposite the third side, wherein the electronics module defines an axis extending from a front to rear of the electronics housing, wherein:
      each of the sides defines a mating feature configured for sliding engagement with a corresponding mating feature of another electronics module in a direction that is parallel to the axis;
      the first side further defines a pin-receiving receptacle;
      the third side further defines a recess extending partially through a width or a thickness of the electronics housing; and
      the fourth side comprises a catch mechanism; and
   a dual-purpose latch mounted at least partially within the recess, comprising:
      a latch body having a top surface, a bottom surface, a front surface, a rear surface, an inner side surface, and an outer side surface, wherein one of the bottom surface or the top surface defines an opening to a generally vertically oriented channel formed in the latch body;
      a hook feature extending rearward from the rear surface and configured to latch onto a corresponding catch mechanism on the another electronics module; and
      a spring-biased pin that is received within the channel and mounted within the recess such that a distal end of the pin extends from the opening beyond the one of the bottom surface or the top surface and beyond at least a portion of the second side of the electronics housing, wherein:
the spring-biased pin enables the dual-purpose latch to slide between a disengaged position and a engaged position;
in the disengaged position the pin and the hook feature are disengaged from the another electronics module housing; and
in the engaged position the pin or the hook feature is engaged with the another electronics housing so as to constrain movement of the electronics module housing relative to the another electronics module housing along the axis.

9. The electronics module having a dual-purpose latch of claim 8, further comprising:
a tab protruding from the front surface that is graspable by a user to lift the dual-purpose latch to move the dual-purpose latch to the disengaged position.

10. The electronics module having a dual-purpose latch of claim 8, wherein:
the dual-purpose latch is biased to stay in the engaged position except when being actuated.

11. The electronics module having a dual-purpose latch of claim 8, wherein:
a rear surface of the hook feature is angled such that upon slidingly contacting the corresponding catch feature, the corresponding catch mechanism pushes the dual-purpose latch into the disengaged position until the corresponding catch mechanism engages an interior of the hook feature.

12. The electronics module having a dual-purpose latch of claim 8, wherein:
in the disengaged position the pin is drawn entirely within the channel and the hook feature is moved to a position to receive or release the corresponding catch feature; and
in the engaged position the distal end of the pin extends from the opening beyond the one of the bottom surface or the top surface such that the distal end of the pin is seatable within a corresponding pin-receiving receptacle formed in the another electronics module housing or the hook feature is in a position to engage the corresponding catch mechanism of the another electronics module housing.

13. The electronics module having a dual-purpose latch of claim 8, wherein:
each of the mating features comprises a dovetail or a dovetail-receiving channel formed on the another electronics module.

14. The electronics module having a dual-purpose latch of claim 8, wherein:
the distal end of the pin is tapered such that the pin is biased inward upon contacting a surface of the another electronics module until the pin is aligned with a pin-receiving receptacle of the another electronics module.

15. A method of coupling electronics modules, comprising:
providing a first electronics module and a second electronics module, each of the electronics modules comprising:
an electronics housing including a first side, a second side positioned opposite the first side, a third side extending in a generally orthogonal direction between the first side and the second side, and a fourth side parallel to and positioned opposite the third side, wherein the electronics module defines an axis extending from a front to rear of the electronics module, wherein each of the sides defines a mating feature configured for sliding engagement with a corresponding mating feature of another electronics module in a direction that is parallel to the axis;
engaging a mounting feature from one of the sides of the first electronics module with a corresponding mating feature from an opposite side of the second electronics module to constrain movement of the electronics modules relative to one another in two directions that are generally orthogonal to the axis;
sliding the first electronics module relative to the second electronics module in a direction that is generally parallel to the axis; and
engaging a dual-purpose latch of the first electronics housing with an engagement feature on the second electronics housing such that one of a hook feature or a spring biased pin of the dual-purpose latch constrains movement of the electronics modules relative to one another in a direction that is generally parallel to the axis.

16. The method of coupling electronics modules of claim 15, wherein:
the one of the sides of the first electronics module comprises the first side;
the method further comprises:
engaging the mounting feature of the of the third side of the first electronics module with a corresponding mating feature from an opposite side of a third electronics module to constrain movement of the first electronics module and the third electronics module relative to one another in two directions that are generally orthogonal to the axis;
sliding the first electronics module relative to the third electronics module in a direction that is generally parallel to the axis; and
engaging the dual-purpose latch of the first electronics module with an additional engagement feature on the third electronics module such that one of the hook feature or the spring-biased pin of the dual-purpose latch constrains movement of the first electronics module and the third electronics module relative to one another in a direction that is generally parallel to the axis such that the first electronics module is locked in a stacked arrangement with one of the second electronics module and the third electronics module and is locked in a side-by-side arrangement with the other of the second electronics module and the third electronics module.

17. The method of coupling electronics modules of claim 16, wherein:
the spring-biased pin of the dual-purpose latch secures the electronics modules that are in the stacked arrangement with one another while the hook feature of the dual-purpose latch secures the electronics modules that are in the side-by-side arrangement with one another.

18. The method of coupling electronics modules of claim 15, wherein:
the first electronic module and the second electronic module are in a vertically stacked arrangement;
the engagement feature comprises a pin-receiving receptacle; and a distal end of the spring-biased pin of the dual-purpose latch is inserted within the pin-receiving receptacle to lock the first electronic module and the second electronic module together.

19. The method of coupling electronics modules of claim 15, wherein:

the first electronic module and the second electronic module are in a horizontal side-by-side arrangement;

the engagement feature comprises a protruding catch mechanism; and an interior of the hook feature of the dual-purpose latch is engaged around the catch mechanism to lock the first electronic module and the second electronic module together.

20. The method of coupling electronics modules of claim 15, further comprising:

actuating the dual-purpose latch to move the dual-purpose latch to a disengagement position in which the one of a hook feature or a spring biased pin of the dual-purpose latch moves out of engagement with the engagement feature on the second electronics module, thereby enabling movement of the electronics modules relative to one another in a direction that is generally parallel to the axis.

* * * * *